(12) United States Patent
Ekinaka et al.

(10) Patent No.: US 11,866,564 B2
(45) Date of Patent: Jan. 9, 2024

(54) POLYMER SUBSTRATE WITH HARD COAT LAYER

(71) Applicants: TEIJIN LIMITED, Osaka (JP); TSUKISHIMA KIKAI CO., LTD., Tokyo (JP)

(72) Inventors: Tatsuya Ekinaka, Osaka (JP); Tatsuichirou Kon, Osaka (JP); Hiroshi Kishimoto, Osaka (JP); Yume Takeda, Osaka (JP); Takehiro Suga, Osaka (JP); Satoshi Ogata, Tokyo (JP); Masato Nakagomi, Tokyo (JP)

(73) Assignees: TEIJIN LIMITED, Osaka (JP); TSUKISHIMA KIKAI CO., LTD., Tokyo (JP)

( * ) Notice: Subject to any disclaimer, the term of this patent is extended or adjusted under 35 U.S.C. 154(b) by 1102 days.

(21) Appl. No.: 16/497,157

(22) PCT Filed: Mar. 28, 2018

(86) PCT No.: PCT/JP2018/012967
§ 371 (c)(1),
(2) Date: Sep. 24, 2019

(87) PCT Pub. No.: WO2018/181572
PCT Pub. Date: Oct. 4, 2018

(65) Prior Publication Data
US 2020/0377682 A1    Dec. 3, 2020

(30) Foreign Application Priority Data
Mar. 29, 2017  (JP) ................... 2017-066424

(51) Int. Cl.
*C08J 7/046* (2020.01)
*C08J 7/04* (2020.01)
(Continued)

(52) U.S. Cl.
CPC ............ *C08J 7/046* (2020.01); *C08J 7/0423* (2020.01); *C23C 16/401* (2013.01); *C23C 16/50* (2013.01);
(Continued)

(58) Field of Classification Search
None
See application file for complete search history.

(56) References Cited

U.S. PATENT DOCUMENTS

| | | | |
|---|---|---|---|
| 6,376,064 | B1 | 4/2002 | Gasworth et al. |
| 2012/0263933 | A1 | 10/2012 | Higuchi et al. |

(Continued)

FOREIGN PATENT DOCUMENTS

| | | |
|---|---|---|
| DE | 100 12 516 | 12/2001 |
| JP | 2010-253683 | 11/2010 |

(Continued)

OTHER PUBLICATIONS

International Search Report dated Jul. 3, 2018 in International (PCT) Application No. PCT/JP2018/012967.

*Primary Examiner* — Colin W. Slifka
(74) *Attorney, Agent, or Firm* — Wenderoth, Lind & Ponack, L.L.P.

(57) ABSTRACT

The present invention is a polymer substrate with a hard coat layer, which is obtained by directly laminating a polymer substrate, a base cured layer and a silicon oxide layer, wherein the base cured layer has a thickness of 1-20 μm and contains 10-90 parts by weight of a polyfunctional acrylate and 90-10 parts by weight of inorganic oxide fine particles and/or a hydrolytic condensation product of a silicon compound or contains a hydrolytic condensation product of an organic silicon compound as a primary component, and the silicon oxide layer satisfies requirement (a1) below at a position 0.04 μm in the thickness direction from the interface (Continued)

between the base cured layer and the silicon oxide layer and satisfies requirement (a3) below at the surface of the silicon oxide layer on the opposite side from the interface, Requirement (a1): when the chemical composition is represented by $SiO_xC_yH_z$, x falls within the range 1.93-1.98, y falls within the range 0.04-0.15 and z falls within the range 0.10-0.50.

Requirement (a3): when the chemical composition is represented by $SiO_xC_yH_z$, x falls within the range 1.94-2.02, y falls within the range 0.05-0.16 and z falls within the range 0.20-0.50.

15 Claims, 4 Drawing Sheets

(51) Int. Cl.
    *C23C 16/40*     (2006.01)
    *C23C 16/50*     (2006.01)

(52) U.S. Cl.
    CPC ........ *C08J 2369/00* (2013.01); *C08J 2433/08* (2013.01); *C08J 2483/04* (2013.01)

(56) References Cited

U.S. PATENT DOCUMENTS

| | | |
|---|---|---|
| 2017/0107345 A1 | 4/2017 | Kon et al. |
| 2018/0265731 A1 | 9/2018 | Ekinaka et al. |

FOREIGN PATENT DOCUMENTS

| | | |
|---|---|---|
| JP | 2012-224077 | 11/2012 |
| JP | 2012-232591 | 11/2012 |
| JP | 2013-35274 | 2/2013 |
| JP | 2013-107382 | 6/2013 |
| JP | 2014-531334 | 11/2014 |
| WO | 2013/032421 | 3/2013 |
| WO | 2015/147295 | 10/2015 |
| WO | 2017/051914 | 3/2017 |

(a)

(b)

POLYMER SUBSTRATE WITH HARD COAT LAYER

FIELD

The present invention relates to a polymer substrate having a hard coating layer. More particularly, the present invention relates to a polymer substrate having a hard coating layer, which demonstrates superior abrasion resistance, high hardness and heat resistance, and can be used for a long period of time even in a harsh usage environment. This polymer substrate having a hard coating layer can be used, for example, automobile window materials, construction members or surface protective plates of solar cells.

BACKGROUND

For example, since resin molding materials having high transparency such as polycarbonate resin or acrylic resin have superior light weight, impact resistance, processability, integration ability with surrounding components and design properties in comparison with inorganic glass, they are widely used in place of organic glass in various types of applications in order to take advantage of these merits.

However, since these resins are inferior to inorganic glass in terms of surface abrasion resistance and hardness, there are many cases in which they are used in the form of polymer substrates provided with a hard coating layer in which a polymer substrate is laminated with a hard coating layer for preventing damage to the polymer substrate.

In the case of polymer substrates having a hard coating layer used in automobile window materials in particular (typically referred to as resin glazing materials), a level of abrasion resistance comparable to that of inorganic glass is required to ensure mechanical strength required for use as a window material as well as visibility in terms of driving safety, while environmental performance is required so as to withstand outdoor exposure for long periods of time. With respect to environmental performance, it is necessary for these polymer substrates to demonstrate performance capable of passing various types of tests in anticipation of direct contact with moisture including inclement weather, use under both high humidity and dry conditions, use under both high temperature and low temperature conditions and exposure to high levels of ultraviolet rays. The previously proposed products can be said to be inadequate for use as resin glazing materials capable of stably realizing all of these required performance levels, With respect to the abrasion resistance of inorganic glass and the like, when referring to standards such as the FMVSS205 safety standard applied in the U.S. or the ECE R43 safety standard applied in Europe, the required level of abrasion resistance with respect to windows used at sites requiring visibility during driving is defined as an increase in haze value ($\Delta H$) of less than 2% or 2% or less as determined with a Taber abrasion test carried out for 1000 revolutions as defined in ASTM D1044.

Although polymer substrates having a hard coating layer (see, for example, Patent Literatures 1 to 7), obtained by depositing an organic silicon-based oxide polymer on a resin substrate by plasma-enhanced chemical vapor deposition (PE-CVD) using an organic silicon compound (such as organosiloxane, organosilane or silazane) for the raw material, have been proposed for use as resin glazing materials for applications requiring both high abrasion resistance and outdoor weather resistance in this manner, typically in the case of providing a hard coating layer having high hardness formed by PE-CVD on an outermost surface, due to the generation of considerable interface stress between the high hardness hard coating layer and the underlayer on which that layer is laminated, it becomes difficult to ensure durability and reliability of the resulting hard coating layer. There are also many cases in which resistance to a boiling water test, which is an accelerated test relating to direct contact with moisture in the usage environment and long-term standing in high-humidity, high-temperature environment (to be referred to as boiling water resistance), as well as resistance to a high-temperature endurance test, which is an accelerated test relating to temperature change in an usage environment (to be referred to as heat resistance), are inadequate, frequently resulting in the observation of defective adhesion of the high hardness hard coating layer as well as other defects such as peeling phenomena or crack formation.

For example, the aforementioned Patent Literature 1 proposes a plastic laminate obtained by sequentially laminating an acrylic resin heat-cured film, an organosiloxane-based resin heat-cured film, and PE-CVD film using an organic silicon compound as raw material on at least one side of a plastic substrate, wherein the PE-CVD film is composed of a gradient zone, in which the abundance ratio of oxygen atoms to silicon atoms (O/Si ratio) increases gradually from the interface with the heat-cured film of the aforementioned organosiloxane-based resin, and a subsequent flat zone, in which the aforementioned ratio is nearly constant, and Examples 1 and 2 therein disclose laminates that realize Taber abrasion resistance performance of 2.0% or less, which is an object of that invention, boiling water resistance as determined by a boiling water immersion test of 2 hours, and heat resistance of 1000 hours at 110° C.

Although these exemplified references were carried out by the present applicants, with respect to the method used to evaluate boiling water resistance, several problems were determined to occur during the course of examinations conducted by the present applicants after the exemplified patent documents were filed. Namely, although the duration of immersion in boiling water is indicated as being 2 hours, it was determined that making the duration of immersion in boiling water to be at least 3 hours and preferably 4 hours or more is preferable in terms of adequately ensuring long-term reliability such as water resistance or moisture resistance. In addition, with respect to the method used to evaluate an adhesion test after immersing in boiling water, it was determined that simply evaluating immediately after testing using the crosscut tape test is inadequate, and that it is necessary to evaluate and confirm results at least 7 days after carrying out the test. This is because it was determined that, since there are many cases in which internal stress (and frequently compressive force) generated during layer formation remains in the silicon oxide layer formed by PE-CVD, and due to the action thereof, there are cases observed in which layer separation occurs over time.

On the basis of these findings, it was decided to carry out evaluation of adhesion in the boiling water test of the present invention according to the procedure described below.

Namely, an adhesion test is carried out in accordance with a crosscut tape test in compliance with JIS K5400 after immersing a polymer substrate having a hard coating layer in boiling water at 100° C. removing the polymer substrate from the boiling water after retaining in the boiling water for 3 hours, removing any adhered moisture, and finally allowing to stand in a room temperature environment for 2 hours. The crosscut tape test is carried out by forming 10×10 squares cut out at 1 mm intervals with a cutter knife in the form of a grid followed by affixing and adhering tape having a prescribed adhesive force (such as Nichiban Cellophane Tape™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" were favorable.

According to this evaluation method, when boiling water resistance of the laminate of the aforementioned Patent Literature 1 was reevaluated, although the "initial result" was favorable (100/100), according to the "elapsed result", separation of the PE-CVD layer laminated according to the PE-CVD method occurred at sites where crosscuts were made. Namely, the result of evaluation in the case of Example 1 was 70/100 (layer separation occurred in 30 of the 100 squares), and the result of evaluation in the case of Example 2 was 0/100 (layer separation occurred in all 100 squares), with satisfactory results being unable to be obtained for both examples, thereby resulting in a need to improve performance.

Moreover, in fields such as automobile windows, a technology is required for blocking infrared rays in order to inhibit the rise in temperature within the vehicle caused by entrance of sunlight.

Although infrared reflection technologies and infrared absorption technologies are employed to block infrared rays, in the case of blocking infrared rays using an infrared absorption technology in particular, although the rise in temperature inside the vehicle can be inhibited, the windows per se conversely end up reaching an extremely high temperature.

In the case of using a resin window produced using the aforementioned technology in such a high-temperature environment, due to the difference between the coefficient of linear expansion of a cured underlayer and the coefficient of linear expansion of a hard coating layer having an oxidation polymer of an organic silicon-based compound deposited thereon, there was the problem of a wavy pattern appearing in the cured underlayer and cracks forming in the hard coating layer having an oxidation polymer of an organic silicon-based compound deposited thereon.

In the case of actually reevaluating the heat resistance of the laminate of the aforementioned Patent Literature 1, although abnormalities were not observed in the test piece even after testing for 1000 hours at a temperature of 110° C., cracks formed in the hard coating layer and silicon oxide layer formed by PE-CVD at the stage 500 hours of testing time had elapsed.

In addition, in the aforementioned Patent Literature 2, a laminate is proposed that has a plurality of coating layers comprising an outermost layer (I), obtained by plasma polymerization of an organic silicon compound, a lower layer (II), having a silicone coating composition containing a composite oxide fine particle dispersion, a silicone resin, a curing catalyst and a solvent, and a lower layer (III) consisting of an arbitrary acrylic resin, on an organic resin substrate, and in Examples 2, 4, 5 and 7, laminates are disclosed that have Taber abrasion resistance performance of 2.0% or less, which is an object of that invention. In addition, a correlation between individual properties of each layer that composes the laminates and performance is also disclosed.

However, in these examples, the haze values of the laminates are high at 2.7% to 3.0%, thereby resulting in the problem of images transmitted through the laminates being unclear, and since this makes their use in applications requiring visibility difficult, an object of present applicants in the form of a polymer substrate having a hard coating layer is not realized. Moreover, in these examples, although results for water resistance performance (using test conditions consisting of 3 days at 65° C.) and an accelerated weather resistance test are disclosed, there is no disclosure of boiling water resistance performance or heat resistance performance, and thus the object of the present applications in the form of a polymer substrate having a hard coating layer and a high level of weather resistance performance cannot be said to be realized.

In addition, in the aforementioned Patent Literature 3, a multilayer product is proposed that is composed of a base material, a first layer obtained with a partial condensate of organosiloxane, and a second layer containing plasma-polymerized organic silicon and deposited at a power level of $10^6$ J/Kg to $10^8$ J/Kg in the presence of excess oxygen, results are disclosed in Example 2 indicating favorable appearance after an outdoor exposure test conducted for 1 year in Florida, U.S.A. (absence of microcracks) and favorable adhesion, and results indicating favorable appearance after an accelerated xenon weather resistance test at a cumulative radiation level of 6875 KJ/m$^2$ (absence of microcracks) and favorable adhesion are disclosed in Examples 4 and 5.

However, in these examples, although the results of an accelerated weather resistance test are disclosed, there is no disclosure of boiling water resistance performance or heat resistance performance, and an object of the present applicants in the form of a polymer substrate having a hard coating layer and a high level of weather resistance performance cannot be said to be realized.

Furthermore, Patent Literature 4 proposes a polymer substrate with a hard coat layer in which a cured underlayer comprising a hydrolysis-condensation product of an organic silicon compound as a main component thereof, and a silicon oxide layer, which is obtained by the PE-CVD of an organic silicon compound and which satisfies specific requirements such as limit compression rate, are laminated on the surface of a polymer substrate. Patent Literature 4 discloses that the heat resistance thereof was suitable at 110° C. for 1000 hours, and that excellent boiling water resistance and weather resistance were obtained.

Though this document was filed by the present applicants, as a result of investigation of the heat resistance evaluation method by the present applicants after the filing of the cited patent applications, it has been found that there is room for improvement regarding the evaluation at 130° C. for 1000 hours.

On the other hand, a configuration has also been proposed in which a UV-cured or heat-cured acrylic resin coating layer is formed instead of a silicone coating layer on a resin substrate, and a layer obtained by plasma polymerization of an organic silicon compound is formed thereon.

Patent Literature 5, for example, discloses a constituent in the form of a laminate obtained by sequentially laminating a cured coating layer (I), consisting of an active energy ray-cured primer composition, and an inorganic substance layer (II) on a resin substrate, wherein the active energy ray-cured primer composition contains (A) a silsesquioxane compound, in which organic groups are directly bound to a silicon atom, and at least one of the organic groups is an organic group having a (meth)acryloyloxy group, and (B) a photopolymerization initiator, and the inorganic substance layer (II) is formed by a dry deposition method.

However, although these examples disclose the results of accelerated weather resistance tests, there are no disclosures regarding boiling water resistance performance or heat resistance performance, and an object of the present applicants in the form of a polymer substrate having a hard coating layer and a high level of weather resistance performance cannot be said to be realized.

In addition, the aforementioned Patent Literature 6 discloses a highly scratch-resistant hard coating film having a composition provided with a first hard coating layer composed of a UV-cured resin, an anchor coating layer composed of an organic-inorganic hybrid film, and a second hard coating layer having high scratch resistance obtained by depositing an organic silicon-based or organic aluminum-based reactive gas when carrying out chemical vapor deposition, on a substrate film.

However, although these examples disclose matters relating to weather resistance performance, there are no disclosures made regarding boiling water resistance performance or heat resistance performance, and an object of the present applicants in the form of a polymer substrate having a hard coating layer and a high level of weather resistance performance cannot be said to be realized.

In addition, the aforementioned Patent Literature 7 discloses an organic resin laminate having weather resistance and scratch resistance, and having an organic resin substrate and a multilayer coating layer on the surface of the substrate, wherein the multilayer coating layer contains a hard coating uppermost surface layer (I), obtained by plasma polymerization of an organic silicon compound, and a hard coating intermediate layer (II) formed from a composite coating composition (2), one side of the intermediate layer (II) contacts the uppermost surface layer, the other side is arranged so as to contact the organic resin substrate, and the composite coating composition (2) contains inorganic oxide nanoparticles (2-A) containing those selected from silica, zinc oxide, titanium oxide, cerium oxide and combinations containing at least one thereof, a vinyl-based copolymer (2-B) having a UV-absorbing group and a reactive group selected from an alkoxysilyl group, hydroxyl group, epoxy group, carboxyl group and amino group, and a solvent (2-C).

However, although these examples disclose the results of accelerated weather resistance tests, there are no disclosures regarding boiling water resistance performance or heat resistance performance, and an object of the present applicants in the form of a polymer substrate having a hard coating layer and a high level of weather resistance performance cannot be said to be realized.

Thus, a polymer substrate having a hard coating layer that demonstrates superior abrasion resistance and heat resistance and enables long-term use even in harsh usage environments has yet to be realized.

CITATION LIST

Patent Literature

Patent Literature 1: Japanese Unexamined Patent Publication No. 2010-253683
Patent Literature 2: Japanese Unexamined Patent Publication No. 2012-224077
Patent literature 3: Japanese Unexamined Patent Publication No, 2012-232591
Patent Literature 4: International Publication WO No. 2015/147295
Patent Literature 5: Japanese Unexamined Patent Publication No. 2013-035274
Patent Literature 6: Japanese Unexamined Patent Publication No. 2013-107382
Patent Literature 7: National Publication of PCT Application No. 2014-531334

SUMMARY

Technical Problem

On the basis of these circumstances, the present invention relates to a polymer substrate with hard coating layer obtained by laminating a high hardness hard coating layer by plasma-enhanced chemical vapor deposition (PE-CVD) on a surface layer, and an object thereof is to obtain a composition capable of realizing the three characteristics consisting of an extremely high level of abrasion resistance comparable to that of inorganic glass, superior boiling water resistance as a typical property of environmental resistance (including an "elapsed result" for adhesion), and superior heat resistance.

Solution to Problem

Namely, the present invention is as described below with respect to solving the aforementioned problems.

<1> A polymer substrate with a hard coat layer in which a polymer substrate, a cured underlayer, and a silicon oxide layer are directly laminated in this order, wherein the cured underlayer has a thickness of 1 to 20 μm, and comprises 10 to 90 parts by weight of a multi-functional acrylate and 90 to 10 parts by weight of inorganic oxide fine particles and/or a silicon compound hydrolysis-condensation product, or comprises a hydrolysis-condensation product of an organic silicon compound as a main component thereof, the silicon layer satisfies the following ($a_1$) at a position 0.04 μm from the interface between the cured underlayer and the silicon oxide layer in the thickness direction and satisfies the following ($a_3$) on a surface on a side opposite the interface:

($a_1$) when the chemical composition is represented by $SiO_xC_yH_z$, x is in the range of 1.93 to 1.98, y is in the range of 0.04 to 0.15, and z is in the range of 0.10 to 0.50, and ($a_3$) when the chemical composition is represented by $SiO_xC_yH_z$, x is in the range of 1.94 to 2.02, y is in the range of 0.05 to 0.16, and z is in the range of 0.20 to 0.50.

<2> The polymer substrate with a hard coat layer according to <1>, wherein the silicon layer satisfies all of the following requirements ($a_1$) to ($c_1$) at a position 0.04 μm from the interface between the cured underlayer and the silicon oxide layer in the thickness direction, and satisfies all of the following requirements ($b_3$) to ($c_3$) on the surface on the side opposite the interface:

($a_1$) when the chemical composition is represented by $SiO_xC_yH_z$, x is in the range of 1.93 to 1.98, y is in the range of 0.04 to 0.15, and z is in the range of 0.10 to 0.45, ($b_1$) the ratio of infrared absorbance at a wave number of 930 $cm^{-1}$ to that at a wave number of 1020 $cm^{-1}$ ($\alpha_{930}/\beta_{1020}$) is in the range of 0.10 to 0.20, ($c_1$) the ratio of infrared absorbance at a wave number of 1280 $cm^{-1}$ to that at a wave number of 1020 $cm^{-1}$ ($\alpha_{1280}/\alpha_{1020}$) is in the range of 0 to 0.005, ($b_3$) the ratio of infrared absorbance at a wave number of 930 $cm^{-1}$ to that at a wave number of 1020 $cm^{-1}$ ($\alpha_{930}/\alpha_{1020}$) is in the range of 0.15 to 0.25, and ($c_3$) the ratio of infrared absorbance at a wave number of 1280 $cm^{-1}$ to that at a wave number of 1020 $cm^{-1}$ ($\alpha_{1280}/\alpha_{1020}$) is in the range of 0.002 to 0.020.

<3> The polymer substrate with a hard coat layer according to <2>, wherein the cured underlayer comprises 10 to 90 parts by weight of a multi-functional acrylate, and 90 to 10 parts by weight of inorganic fine particles and/or a silicon compound hydrolysis-condensation product.

<4> The polymer substrate with a hard coat layer according to any one of <1> to <3>, wherein y of ($a_3$) is 0.02 to 0.10 greater than y of ($a_1$), and z of ($a_3$) is 0.05 to 0.25 greater than z of ($a_1$).

<5> The polymer substrate with a hard coat layer according to any one of <1> to <4>, wherein the cured underlayer comprises a (meth)acrylic resin including 0.1 to 5 mol/kg of at least one of a hydroxyl group, an amino group, a carboxyl group, or an alkoxysilyl group in the compound.

<6> The polymer substrate with a hard coat layer according to any one of <1> to <5>, wherein the primary particle diameter of the inorganic oxide fine particles is in the range of 1 nm to 200 nm.

<7> The polymer substrate with a hard coat layer according to any one of <1> to <6>, wherein the polymer substrate is a polycarbonate resin substrate.

<8> The polymer substrate with a hard coat layer according to any one of <1> to <7>, wherein the silicon oxide layer is a plasma CVD layer.

<9> The polymer substrate with a hard coat layer according to any one of <1> to <8>, wherein the silicon oxide layer has a thickness of 2.5 to 9 μm, and satisfies all of the following requirements ($a_2$) to ($c_2$) at a position 2.0 μm from the interface between the cured underlayer and the silicon oxide layer in the thickness direction:

($a_2$) when the chemical composition is represented by $SiO_xC_yH_z$, x is in the range of 1.81 to 1.90, y is in the range of 0.15 to 0.32, and z is in the range of 0.45 to 0.90, ($b_2$) the ratio of infrared absorbance at a wave number of 930 $cm^{-1}$ to that at a wave number of 1020 $cm^{-1}$ ($\alpha_{930}/\alpha_{1020}$) is in the range of 0.21 to 0.36, and ($c_2$) the ratio of infrared absorbance at a wave number of 1280 $cm^1$ to that at a wave number of 1020 $cm^{-1}$ ($\alpha_{1280}/\alpha_{1020}$) is in the range of 0.010 to 0.040.

<10> The polymer substrate with a hard coat layer according to <9>, wherein the thickness of a portion of the silicon oxide layer which satisfies all of requirements ($a_2$) to ($c_2$) is in the range of 1.5 to 8.5 μm.

<11> The polymer substrate with a hard coat layer according to <9> or <10>, wherein the thickness of a portion of the silicon oxide layer which satisfies all of requirements ($a_3$) to ($c_3$) is in the range of 0.1 to 1.4 μm.

<12> The polymer substrate with a hard coat layer according to any one of <9> to <11>, further comprising, between the portion of the silicon oxide layer which satisfies all of requirements ($a_1$) to ($c_1$) and the portion of the silicon oxide layer which satisfies all of requirements ($a_2$) to ($c_2$), a gradient layer in which the values of x, y, z, $\alpha_{930}/\alpha_{1020}$ and/or $\alpha_{1280}/\alpha_{1020}$ change gradually.

<13> The polymer substrate with a hard coat layer according to any one of <9> to <12>, further comprising, between the portion of the silicon oxide layer which satisfies all of requirements ($a_2$) to ($c_2$) and the portion of the silicon oxide layer which satisfies all of requirements ($a_3$) to ($c_3$), a gradient layer in which the values of x, y, z, $\alpha_{930}/\alpha_{1020}$ and/or $\alpha_{1280}/\alpha_{1020}$ change gradually.

<14> The polymer substrate with a hard coat layer according to any one of <1> to <8>, wherein the thickness of the silicon oxide layer is in the range of 0.1 to 2.5 μm.

<15> The polymer substrate with a hard coat layer according to <14>, further comprising, between the portion of the silicon oxide layer which satisfies all of requirements ($a_1$) to ($c_1$) and the portion of the silicon oxide layer which satisfies all of requirements ($a_3$) to ($c_3$), a gradient layer in which the values of x, y, z, $\alpha_{930}/\alpha_{1020}$ and/or $\alpha_{1280}/\alpha_{1020}$ change gradually.

Advantageous Effects of Invention

According to the present invention, since a polymer substrate with hard coating layer can be obtained that is provided with an extremely high level of abrasion resistance comparable to that of inorganic glass and the like, the ability to withstand harsh environmental conditions corresponding to outdoor use (boiling water resistance (elapsed adhesion)) and heat resistance, it can be used in a wide range of applications as a high-performance resin glazing material for use in automobile window glass and the like.

DESCRIPTION OF EMBODIMENTS

Figure 4:
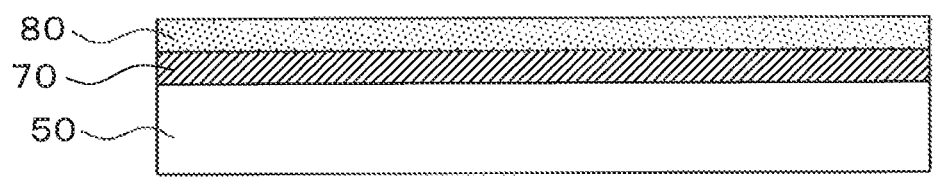
FIG. 4 is a cross-sectional schematic diagram of a polymer substrate with hard coating layer applied in one aspect of the present invention.
Figure 5:
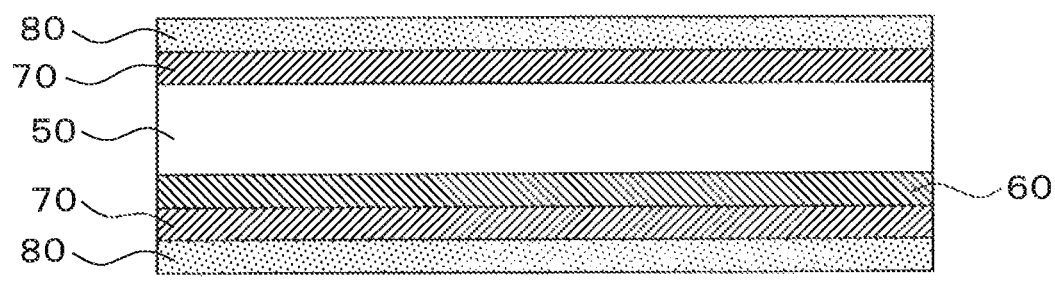
FIG. 5 is a cross-sectional schematic diagram of a polymer substrate with hard coating layer applied in another aspect of the present invention.

In the present invention, as shown in FIGS. 4 and 5, although it is essential that the cured underlayer 70 and the silicon oxide layer 80 obtained by PE-CVD be laminated in that order on at least one side of the polymer substrate 50, the laminated layers are not required to be present on the other side, and a preferable configuration is selected according to the application as necessary. For example, as shown in FIG. 4, another layer may be present on the other side of the polymer substrate 50. In addition, as shown in FIG. 5, for example, a layer other than an adhesive layer 60, the cured underlayer 70 and the silicon oxide layer 80 obtained by PE-CVD (such as a UV-cured resin layer) can be selected to be laminated and formed on the other side of the polymer substrate 50.

The following provides a sequential detailed explanation of each component that composes the polymer substrate with hard coating layer according to the present invention and methods for adjusting each component.

<Polymer Substrate 50>

Examples of materials of the polymer substrate 50 include polycarbonate resin, acrylic resin such as polymethyl methacrylate, polyester resin such as polyethylene terephthalate, polybutylene terephthalate or poly(ethylene-2,6-naphthalate), polystyrene resin, polypropylene resin, polyarylate resin, polyethersulfone resin, ABS resin and polylactic acid resin. These resins can be used alone or two or more types can be used as a mixture. Among these, polycarbonate resin having superior transparency, heat resistance and impact resistance is particularly preferable in the case of considering use in automobile window applications. Acrylic coated polycarbonate substrate obtained by co-extruding polycarbonate resin with acrylic resin which coats the surface is particularly preferable as the polymer substrate.

Furthermore, with respect to resin heat resistance, the heat distortion temperature (IIDT) is preferably 100° C. or higher, more preferably 120° C. or higher and even more preferably 130° C. or higher.

One example of a polycarbonate resin is a polycarbonate resin obtained by reacting a divalent phenol and a carbonate precursor by an interfacial polycondensation method or a fusion method. Typical examples of divalent phenols include 2,2-bis(4-hydroxyphenyl)propane (commonly referred to as bisphenol A), 2,2-bis(3-methyl-4-hydroxyphenyl)propane, dimethyl-4-hydroxyphenyl)propane, 1,1-bis(4-hydroxyphenyl)ethane, 1,1-bis(4-hydroxyphenyl)cyclohexane, 2,2-bis (4-hydroxyphenyl)butane, 2,2-bis(4-hydroxyphenyl)-3-methylbutane, 9,9-bis{(4-hydroxy-3-methyl) phenyl}fluorene, 2,2-bis(4-hydroxyphenyl)-3,3-dimethylbutane, 2,2-bis(4-hydroxyphenyl)-4-methylpentane, d1,1-bis(4-hydroxyphenyl)-3,3,5-trimethylcyclohexane and α,α-bis(4-hydroxyphenyl)-m-diisopropylbenzene, bis(4-hydroxyphenyl)sulfide and bis(4-hydroxyphenyfisulfone, and among these, bisphenol A is preferable. These divalent phenols can be used alone or two or more types can be used as a mixture.

In addition, a carbonyl halide, carbonate ester or haloformate and the like is used for the carbonate precursor, and specific examples thereof include phosgene, diphenyl carbonate and dihaloformates of divalent phenols.

In the production of a polycarbonate resin by reacting a divalent phenol and carbonate precursor by an interfacial polycondensation method or fusion method, a catalyst, chain-end terminator or antioxidant of a divalent phenol may be used as necessary. In addition, the polycarbonate resin may be a branched polycarbonate resin obtained by copolymerizing a polyfunctional aromatic compound having three or more functional groups, or may be a mixture obtained by mixing two or more types of the resulting polycarbonate resins.

The molecular weight of the polycarbonate resin in terms of the viscosity-average molecular weight (M) is preferably 10.000 to 50.000 and more preferably 15,000 to 35,000. A polycarbonate resin having this viscosity-average molecular weight allows the obtaining of adequate strength and demonstrates favorable melt fluidity during molding, thereby making this preferable.

Viscosity-average molecular weight as referred to in the present invention is determined by substituting specific viscosity ($\eta_{sp}$), which is determined from a solution obtained by dissolving 0.7 g of polycarbonate resin in 100 ml of methylene chloride at 20° C., into the formula indicated below.

$$\Theta_{sp}/c = [\eta] + 0.45 \times [\eta]^2 c \text{ (where, } [\eta] \text{ represents limiting viscosity)}$$

$$[\eta] = 1.23 \times 10^{-4} M^{0.83}$$

$$c = 0.7$$

In addition, other preferable examples of polycarbonate resins include polycarbonate resin obtained by copolymerization of isosorbide and an aliphatic diol, and various types of copolymerized polycarbonates such as polycarbonate-polyorganosiloxane copolymers.

The polycarbonate resin can be used after adding and mixing therein a stabilizer such as a phosphite ester or phosphonate ester, a flame retardant such as tetrabromobisphenol A, a low molecular weight polycarbonate of tetrabromobisphenol A or decabromodiphenol, an organic ultraviolet absorber such as a benzotriazole, benzophenone, triazine or salicylate, an inorganic ultraviolet absorber such as titanium oxide, cerium oxide or zinc oxide, an ultraviolet shielding agent such as a cyanine-based compound, squarylium-based compound, thiol-nickel complex salt-based compound, phthalocyanine-based compound, triallylmethane-based compound, naphthoquinone-based compound, anthraquinone-based compound, carbon black, antimony oxide, tin oxide doped with indium oxide or lanthanum boride, a colorant or a lubricant as necessary.

Furthermore, the thickness of the polymer substrate is preferably within the range of 1 mm to 20 mm. If the thickness is less than 1 mm, it becomes difficult to retain mechanical strength required by an automobile window and the like, flexural deformation of the substrate increases accompanying lamination of the silicon oxide layer by PE-CVD, and there are many cases in which problems with dimensional stability and appearance occur, thereby making this undesirable. On the other hand, if the thickness exceeds 20 mm, it becomes difficult to retain surface smoothness necessary for a window material and obtain a molded substrate having a low level of optical distortion (such as perspective distortion) while also increasing the substrate weight, thereby making this undesirable.

The thickness of the polymer substrate is more preferably 2 mm to 10 mm and even more preferably 3 min to 7 mm.

Cured Underlayer 70—First Embodiment

The cured underlayer 70 of the first embodiment is laminated on the surface of the polymer substrate, contains a hydrolysis-condensation product of an organic silicon compound as the main component thereof, contains 10 to 90 parts by weight of a multi-functional acrylate and 90 to 10 parts by weight of inorganic oxide fine particles and/or silicon compound hydrolysis-condensation product, and the thickness thereof is 1 to 20 μm. This thickness may be, for example, 1 μm or more, 3 μm or more or 5 μm or more, and 20 μm or less, 15 μm or less or 10 μm or less.

This cured underlayer (70) is preferably a layer obtained by heat curing or active energy ray curing of a precursor composition containing 10 to 90 parts by weight of a multi-functional acrylate having two or more (meth)acryloyl groups in a molecule thereof and 90 to 10 parts by weight of inorganic oxide fine particles and/or a silicon compound hydrolysis-condensation product (to be referred to as the "precursor composition"), and is particularly preferably a layer obtained by active energy ray curing.

Furthermore, in the present invention, the term "(meth) acrylate" refers to both an acrylate and methacrylate, and a "(meth)acryloyl group" refers to both an acryloyl group and a methacryloyl group.

Examples of this multi-functional (meth)acrylate include trimethylolpropane (meth)acrylate, ethylene oxide-modified trimethylolpropane (meth)acrylate, propylene oxide-modified trimethylolpropane (meth)acrylate, glycerin di(meth) acrylate, bis(2-(meth)acryloyloxyethyl)hydroxyethyl isocyanurate, pentaerythritol tri(meth)acrylate, ditrimethylolpropane tri(meth)acrylate and dipentaerythritol penta(meth)acrylate.

Although one type of these (meth)acrylates can be used, two or more types are preferably used in combination to achieve balance between hardness and flexibility. In addition, among these (meth)acrylates, pentaerythritol tri(meth)acrylate and pentaerythritol tetra(meth)acrylate are preferably incorporated in fixed amounts since they are capable of improving scratch resistance.

Examples of inorganic oxide fine particles include titanium oxide, zinc oxide, cerium oxide, and silicon oxide fine particles. The primary particle diameter of the inorganic oxide fine particles is preferably from 1 nm to 200 nm, and more preferably from 1 nm to 100 nm. This range provides the cured underlayer with good transparency and good weather resistance.

Examples of the silicon compound hydrolysis-condensation product include alkoxysilane compounds, and more specifically, hydrolysis-condensation products including alkyltrialkoxysilanes such as methyltrimethoxysilane, methyltriethoxysilane, ethyltrimethoxysilane or ethyltriethoxysilane, 3-(meth)acryloyloxypropyltrialkoxysilanes such as 3-(meth)acryloyloxypropyltrimethoxysilane or 3-(meth)acryloyloxypropyltriethoxysilane, vinyltrialkoxysilanes such as vinyltrimethoxysilane or vinyltriethoxysilane, aminomethoxysilane, aminomethyltriethoxysilane, 2-aminoethyltrimethoxysilane, 2-aminoethyltriethoxysilane, 3-aminopropyltrimethoxysilane and 3-aminopropyltriethoxysilane.

In a hydrolysis-condensation reaction, the condensation reaction proceeds together with hydrolysis, the majority, and preferably 100%, of the hydrolyzable groups of the hydrolyzable silane are hydrolyzed to hydroxyl groups (OH), and the majority, and preferably 80% or more, more preferably 85% or more, and particularly preferably 90% or more, of the OH groups are condensed, which is preferable from the viewpoint of liquid stability.

Although the hydrolysis reaction may be carried out with alkoxysilane alone, it is preferably carried out in the presence of inorganic oxide fine particles in order to improve dispersibility of the inorganic oxide fine particles.

In addition, a compound is preferably reacted and used that has a (meth)acrylic resin having alkoxysilyl groups in a side chain thereof, a (meth)acrylic resin having hydroxyl groups, amino groups or carboxyl groups which are highly polar in a side chain thereof, and inorganic oxide fine particles and/or a silicon compound hydrolysis-condensation product in order to improve dispersibility of the inorganic fine particles.

Examples of these (meth)acrylic resins having alkoxysilyl groups in a side chain thereof include copolymers of a (meth)acrylic monomer having alkoxysilyl groups represented by general formula (1):

[Chemical Formula 1]

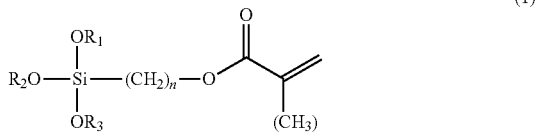

(wherein, $R_1$, $R_2$ and $R_3$ respectively and independently represent an alkyl group having 1 to 4 carbon atoms, and n represents an integer of 1 to 6), and another (meth)acrylic monomer.

Examples of other monomers are indicated in the following sections (1) to (5):

(1) (meth)acrylic esters having an alkyl group having 1 to 22 carbon atoms such as methyl (meth)acrylate, ethyl (meth)acrylate, propyl (meth)acrylate, n-butyl (meth)acrylate, t-butyl (meth)acrylate, hexyl (meth)acrylate, heptyl (meth)acrylate, octyl (meth)acrylate, nonyl (meth)acrylate, decyl (meth)acrylate, dodecyl (meth)acrylate, tetradecyl (meth)acrylate, hexadecyl (meth)acrylate, stearyl (meth)acrylate, octadecyl (meth)acrylate or docosyl (meth)acrylate;

(2) (meth)acrylic esters having an alicyclic alkyl group such as cyclohexyl (meth)acrylate, isobornyl (meth)acrylate, dicyclopentanyl (meth)acrylate or dicylopentenyloxyethyl (meth)acrylate;

(3) (meth)acrylic esters having an aromatic ring such as benzoyloxyethyl (meth)acrylate, benzyl (meth)acrylate, phenylethyl (meth)acrylate, phenoxyethyl (meth)acrylate, phenoxydiethylene glycol (meth)acrylate or 2-hydroxy-3-phenoxypropyl (meth)acrylate;

(4) (meth)acrylic esters having a hydroxyalkyl group such as hydroxyethyl (meth)acrylate, hydroxypropyl (meth)acrylate, hydroxybutyl (meth)acrylate, glycerol (meth)acrylate, lactone-modified hydroxyethyl (meth)acrylate or meth(acrylic) esters having a polyalkylene glycol group such as polyethylene glycol (meth)acrylate or polypropylene glycol (meth)acrylate; and, (5) unsaturated carboxylic esters such as dimethyl fumarate, diethyl fumarate, dibutyl fumarate, dimethyl itaconate, dibutyl itaconate, methylethyl fumarate, methylbutyl fumarate or methylethyl itaconate.

In addition, examples of (meth)acrylic resins having hydroxyl groups, amino groups or carboxyl groups which are highly polar in a side chain thereof include polymers obtained by copolymerizing a polymerizable monomer having a (meth)acryloyl group and an epoxy group with another monomer followed by expressing the polar group by carrying out a ring-opening reaction on the epoxy group, and polymers of an acrylic monomer having a polar group, such as hydroxyethyl (meth)acrylate, aminopropyl (meth)acrylate or (meth)acrylic acid, and another acrylic monomer.

Examples of other monomers include the previously described (meth)acrylic esters.

These (meth)acrylic resins preferably contain 0.1 to 5.0 mol/kg, and for example, 3.0 to 4.0 mol/kg, of hydroxyl groups, amino groups, carboxyl groups, alkoxysilyl groups or combination thereof within the compound. The content of the hydroxyl groups, amino groups, carboxyl groups, alkoxysilyl groups or combination thereof is determined by dividing the weight of each monomer used when polymerizing the (meth)acrylic resin by the molecular weight thereof to calculate the incorporated substance equivalent, by totaling the product of that value and the number of hydroxyl groups, amino groups, carboxyl groups or alkoxysilyl groups contained in a single molecule of each monomer used, and by dividing the total value by the total weight of the used monomers to obtain the quotient thereof.

Since organic components such as acrylic resin and inorganic components such as colloidal silica can be uniformly dispersed in the reaction products and the reaction products can be favorably dispersed in the organic component and inorganic component by reacting the acrylic resin with colloidal silica and/or a silicon compound hydrolysis-condensation product, the presence of these reaction products facilitates compatibility between the organic component and inorganic component, thereby enhancing uniformity of the organic component and inorganic component in the coating layer.

At the lower limit or higher of the amount of hydroxyl groups, amino groups, carboxyl groups, alkoxysilyl groups or combination thereof contained in the (meth)acrylic resin compound, the ability to be compatible with the inorganic component is adequate, thereby making this preferable, and if that amount is equal to or less than the upper limit, the coating layer is resistant to peeling and cracking in a boiling water test without undergoing a decrease in water resistance of the cured underlayer.

A cured underlayer prepared in this manner is able to realize an extremely favorable surface for ensuring adhesion with the silicon oxide layer obtained by PE-CVD as a result of decomposing or removing a portion of the organic component in the layer by subsequently subjecting to surface treatment, such as plasma treatment (under atmospheric pressure or vacuum), flame treatment, corona treatment, UV (from 150 nm to 400 nm) (ozone) treatment or chemical agent treatment, and gradually increasing the proportion of inorganic component in a sloping manner moving towards the surface.

Further, in order to obtain superior environmental resistance or boiling water resistance of the present invention, the surface of the cured underlayer preferably has 35° or less of water contact angle, and from 0.7 to 10.0 nm of surface roughness (Ra) when measured using the DFM method under conditions of observing by 5.0 μm square. Since the cured underlayer has frequently electrically insulation property, the surface is advantageously observed by DFM method, as explained below.

Here, water contact angle reflects the magnitude of the intermolecular force between the surface of the polymer substrate and a polar substance. Namely, although a liquid such as water on a solid surface becomes spherical as a result of reducing surface area if intermolecular force between the water and the surface is not present, if intermolecular force (surface energy) acts between the solid surface and the water, the water spreads over the solid surface as a result of having been stabilized by acquiring a larger amount of surface energy and the contact angle decreases. Since it is necessary to overcome the intermolecular force between the water and solid surface in order to remove water in this state from a solid, a large amount of energy is required (namely, it is difficult to remove the water). Since the silicon oxide layer obtained by PE-CVD is a highly polar layer, it is stabilized by acquiring a large amount of surface energy from a solid surface having a small water contact angle.

The water contact angle of the substrate surface of the present invention is preferably 35° or less since this allows the obtaining of adequate adhesive strength with the silicon oxide layer.

Further, although surface roughness as measured in the DFM mode reflects surface smoothness of the surface of the cured underlayer at the nano-level, in terms of enhancing adhesive strength with the silicon oxide layer obtained by PE-CVD, suitable surface irregularities defined by a preferable range of surface roughness are preferably present. Surface irregularities refer to those observed in the DFM mode in the form of independent or mutually connected holes and/or projections, and the presence of these surface irregularities is thought to enhance anchoring effects relating to improvement of adhesive strength.

If surface roughness (Ra) of the surface of the cured underlayer of the present invention is less than 0.7 nm, it becomes difficult to obtain an effect that improves adhesive strength, while if surface roughness (Ra) exceeds 10.0 nm, mechanical strength of the surface of the cured underlayer decreases, and there are cases in which this leads to a decrease in adhesive strength as a result thereof, thereby making this undesirable. More preferably, surface roughness (Ra) of the surface of the cured underlayer is within the range of 1.0 nm to 5.0 nm.

Furthermore, in the same manner as previously described, measurement using the DFM mode is preferably carried out under conditions of an observation area of 5 μm square using 256×256 measuring points, and measurements are preferably made in a plurality of regions followed by using the average value thereof.

Curing of the coating layer is preferably carried out by adding a photopolymerization initiator to the cured underlayer coating agent and irradiating with ultraviolet light.

Examples of the photopolymerization initiator include those indicated in the following sections (a) to (d), and these may be used alone or two or more types may be used in combination:

(a) benzophenone and various types of benzophenones such as 3,3'-dimethyl-4-methoxybenzophenone, 4,4'-bisdimethylaminobenzophenone, 4,4'-bisdiethylaminobenzophenone, 4,4'-dichlorobenzophenone, Michler's ketone or 3,3',4,4'-tetra(t- butylperoxycarbonyl)benzophenone;

(b) xanthones and thioxanthones such as xanthone, thioxanthone, 2-methylthioxanthone. 2-chlorothioxanthone or 2,4-diethylthioxanthone, acyloin ethers such as benzoin, benzoin methyl ether, benzoin ethyl ether or benzoin isopropyl ether;

(c) α-diketones such as benzyl or diacetyl diketones, sulfides such as tetramethylthiuram disulfide or p-tolyl disulfide, benzoic acids such as 4-methylaminobenzoic acid or 4-dimethylaminobenzoic acid; and, (d) 3,3-carbonylbis(7-diethylamino)coumarin, 1-hydroxycyclohexyl phenyl ketone, 2,2'-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, bis(2,4,6-trimethylbenzoyl)phenylphosphine oxide, 1-[4-(2-hydroxyethoxy)phenyl]-2-hydroxy-2-methyl-1-propan-1-one, 1-(4-isopropylphenyl)-2-hydroxy-2-methylpropan-1-one, 1-(4-dodecylphenyl)-2-hydroxy-2-methylpropan-1-one, 4-benzoyl-4'-methyldimethylsulfide, 2,2'-diethoxyacetophenone, benzyl dimethyl ketal, benzyl-β-methoxyethylacetal, methyl o-benzoylbenzoate, bis(4-dimethylaminophenyl)ketone, p-dimethylaminoacetophenone, α,α-dichloro-4-phenoxyacetophenone, pentyl-4-dimethylaminobenzoate, 2-(o-chlorophenyl)-4,5-diphenylimidazolyl dimer, 2,4-bis-trichloromethyl-6-[di-(ethoxycarbonylmethyl)amino]phenyl-S-triazine, 2,4-bis-trichloromethyl-6-(4-ethoxy)phenyl-S-triazine, 2,4-bis-trichloromethyl-6-(3-bromo-4-ethoxy) phenyl-S-triazine anthraquinone, 2-t-butyl anthraquinone, 2-amyl anthraquinone and β-chloroanthraquinone.

Among the aforementioned photopolymerization initiators, the use of one type or a mixed system of two or more types selected from the group consisting of 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propan-1-one, thioxanthone and thioxanthone derivatives, 2,2'-dimethoxy-1,2-diphenylethan-1-one, 2,4,6-trimethylbenzoyl diphenylphosphine oxide, bis(2,46-trimethylbenzoyl)phenylphosphine oxide, 2-methyl-1-[4-(methylthio)phenyl]-2-morpholino-1-propanone and 2-benzyl-2-dimethylamino-1-(4-morpholinophenyl)-butan-1-one is preferable since activity is indicated for light of a wider range of wavelengths, thereby allowing the obtaining of a highly curable coating.

The amount of the aforementioned photopolymerization initiator used is preferably an amount within a range that allows the function thereof as a photopolymerization initiator to be adequately demonstrated but does not allow the occurrence of crystal precipitation or deterioration of coating properties, and more specifically, the photopolymerization initiator is preferably used within a range of 0.05 to 20 parts by weight, and particularly preferably used within a range of 0.1 to 10 parts by weight, based on 100 parts by weight of the resin composition.

The resin composition of the present invention may further use various photosensitizers together with the aforementioned photopolymerization initiator. Examples of photosensitizers include amines, ureas, sulfur-containing compounds, phosphorous-containing compounds, chlorine-containing compounds, and nitriles and other nitrogen-containing compounds.

An ultraviolet absorber or solvent is further added as necessary to the cured underlayer coating agent of the present invention. An organic or inorganic ultraviolet absorber can be used for the aforementioned ultraviolet absorber, and examples of organic ultraviolet absorbers include triazine derivatives such as 2-[4-{(2-hydroxy-3-dodecyloxypropyl)oxy}-2-hydroxyphenyl]-4,6-bis(2,4-dimethylphenyl)-1,3,5-triazine or 2[4-{(2-hydroxy-3 tridecyloxypropyl)oxy}-2-hydroxyphenyl]-4,6-bis(2,4-dimethylphenyl)-1,3,5-triazine, as well as 2-(2"-xanthenecarboxy-5°-methylphenyl)benzotriazole, 2-(2'-o-nitrobenzyloxy-5'-methylphenyl)benzotriazole, 2-xanthenecarboxy-4-dodecyloxybenzophenone and 2-o-nitrobenzyloxy-4-dodecyloxybenzophenone. In addition, examples of inorganic ultraviolet absorbers include metal oxide fine particles such as titanium oxide, zinc oxide or cerium oxide fine particles. Among these ultraviolet absorbers, triazine-based ultraviolet absorbers are used particularly preferably from the viewpoints of the intensity and wavelength of ultraviolet absorption, resistance to decomposition and resistance to elution.

There are no particular limitations on the solvent provided it is a solvent that has affinity with both the (meth)acrylic resin and inorganic fine particles present in the coating agent, and examples thereof are as follows:

ketone-based solvents such as acetone, methyl ethyl ketone, methyl n-propyl ketone, methyl isopropyl ketone, methyl n-butyl ketone, methyl isobutyl ketone, methyl n-amyl ketone, methyl n-hexyl ketone, diethyl ketone, ethyl n-butyl ketone, di-n-propyl ketone, diisobutyl ketone, cyclohexanone or isophorone;

ether-based solvents such as ethyl ether, isopropyl ether, n-butyl ether, diisoamyl ether, ethylene glycol dimethyl ether, ethylene glycol diethyl ether, diethylene glycol dimethyl ether, diethylene glycol, dioxane or tetrahydrofuram;

ester-based solvents such as ethyl formate, propyl formate, n-butyl formate, ethyl acetate, n-propyl acetate, isopropyl acetate, n-butyl acetate, n-amyl acetate, ethylene glycol monomethyl ether acetate, ethylene glycol monoethyl ether acetate, diethylene glycol monomethyl ether acetate, diethylene glycol monoethyl ether acetate, propylene glycol monomethyl ether acetate or ethyl-3-ethoxypropionate;

alcohol-based solvents such as methanol, ethanol, isopropyl alcohol, n-butyl alcohol, isobutyl alcohol, diacetone alcohol, 3-methoxy-1-propanol, 3-methoxy-1-butanol or 3-methyl-3-methoxybutanol; and, hydrocarbon-based solvents such as toluene, xylene, Solvesso 100, Solvesso 150, Swazol 1800, Swazol 310, Isopar E, Isopar G, Exxon Naphtha No. 5 and Exxon Naphtha No. 6.

These solvents may be used alone or two or more types may be used in combination, In the case of forming the cured underlayer, the thickness of the cured layer is preferably within the range of 1 to 20 μm, more preferably within the range of 2 to 15 μm, even more preferably within the range of 3 to 10 μm, and most preferably within the range of 4 to 10 μm. If the thickness is less than 1 μm, the thickness is inadequate for absorbing the difference in coefficient of linear expansion with the silicon oxide layer obtained by PE-CVD, thereby resulting in a lack of adhesion in a heat resistance test and the formation of cracks due to thermal stress. In addition, if the thickness exceeds 20 μm, cracks form in the underlayer attributable to stress accompanying cure shrinkage of the layer, or wavy marks remain in the underlayer due to the silicon oxide layer strongly inhibiting expansion of the underlayer during a rise in temperature attributable to a difference in coefficient of linear expansion between the underlayer and the silicon oxide layer.

In the present invention, the surface status of the cured underlayer is preferably controlled and adjusted to a preferable range prior to starting to form the silicon oxide layer by PE-CVD, Namely, surface roughness (Ra) in the case of having measured the surface of the cured underlayer immediately prior to lamination of the silicon oxide layer by PE-CVD at a water contact angle of 35° or less under observation conditions of measuring 5 μm in all directions in the dynamic mode (DFM) of an atomic force microscope is preferably adjusted to within the range of 0.7 to 10 nm, and an example of a specific method thereof consists of carrying out plasma treatment on the surface of the cured underlayer immediately prior to laminating the silicon oxide layer by PE-CVD.

Plasma treatment refers to a treatment consisting of colliding a gaseous species and electrons imparted with a high level of kinetic energy by plasma excitation with the surface of the cured underlayer, and consists of activation of the surface of the cured underlayer (appearance of active groups due to severing of chemical bonds and crosslinking structure) and aging treatment at those portions where crosslink density of the surface layer is low.

An example of a specific method consists of evacuating the inside of a chamber by drawing a vacuum with a substrate placed on one of the electrodes using a capacitive coupling type of plasma device that uses parallel plate electrodes, followed by allowing a treatment gas to flow in and applying a high-frequency magnetic field (such as that at a frequency of 13.56 MHz) to generate plasma.

The main control parameters of plasma treatment include the type of gas, gas pressure or flow rate (and directly, the gas concentration in the vicinity of the substrate), the applied power of the high-frequency magnetic field (to be referred to as high-frequency applied power), distance between electrodes and treatment time, and these parameters can be used to control treatment intensity.

Although both an inert gas such as argon, helium or krypton, as well as an active gas such as oxygen, nitrogen, water or carbon dioxide in the case of incorporating in a chemically bonded state in the treatment target depending on the plasma excitation conditions, can be used for the gaseous species, in consideration of the object of the present invention, a gas mainly composed of an inert gas is preferable due to the ease of controlling the surface of the cured underlayer, and argon gas is used particularly preferably due to its superior controllability.

Although it is difficult to universally specify preferable ranges for the gas flow rate, high--frequency applied power and distance between electrodes since they are dependent on the surface area of the substrate and electrodes, the volume of the vacuum chamber, the shape of the substrate and the like, in the case of a flat substrate and converting to a surface area in square meters, the gas flow rate is generally within the range of about 1000 sccm to 5000 sccm, and the high-frequency applied power is preferably controlled to within a range of about 2 KW to 7 KW and more preferably 3 KW to 5 KW.

Treatment time is preferably generally within the range of about 1 minute to 20 minutes, more preferably about 2 minutes to 15 minutes and even more preferably about 3 minutes to 10 minutes.

As a result of controlling these treatment parameters, the surface status of the cured underlayer is preferably controlled and adjusted to a preferable range prior to starting to form the silicon oxide layer by PE-CVD.

Furthermore, plasma treatment can also be carried out with a device other than a capacitive coupling type of CVD device that uses parallel plate electrodes as described above, and examples thereof include an inductively coupled CVD device that generates plasma around a substrate by generating a high-frequency magnetic field with a magnetic field coil arranged around the substrate, and a method consisting of allowing gas particles imparted with high energy from a plasma field primarily using an inductively coupled plasma gun to accelerate and collide with a substrate surface by injection pressure or an electromagnetic field.

Cured Underlayer 70—Second Embodiment

Though the use of the cured underlayer 70 of the first embodiment described above as the cured underlayer 70 is preferable from the viewpoint that high boiling water resistance and heat resistance can be obtained, a cured underlayer 70 obtained by crosslinking and curing a precursor composition comprising a hydrolysis-condensation product of an organic silicon compound as a main component can be used as a second embodiment. The cured underlayer described in Patent Literature 4 can be used as such a layer. The contents of this document are incorporated herein by way of reference.

Other than the hydrolysis-condensation product of an organic silicon compound, the precursor composition may include silica fine particles as inorganic oxide fine particles having a primary particle diameter of 1 to 200 nm, and as needed, may include metal oxide fine particles.

Regarding the suitable ranges of the surface roughness (Ra), the water contact angle, and the thickness of the cured underlayer 70 of the second embodiment, refer to the description of the cured underlayer 70 of the first embodiment, <Silicon Oxide Layer 80>

With respect to the polymer substrate with hard coating layer of the present invention, examples of configuration requirements required of the silicon oxide layer obtained by PE-CVD in order to satisfy the three characteristics of an extremely high level of abrasion resistance comparable to that of inorganic glass, boiling water resistance (including adhesion) and heat resistance include film thickness of the silicon oxide layer, mechanical properties (elastic modulus, hardness) and a high degree of compactness with respect to the microstructure of the silicon oxide layer.

Though described in detail below, the silicon oxide layer on the cured underlayer includes an initial dense layer and a high hardness layer in this order from the cured underlayer side. Furthermore, the silicon oxide layer may include a bulk layer between the initial dense layer and the high hardness layer.

The silicon oxide layer of the present invention preferably satisfies all of the following requirements ($a_1$) to ($c_1$) at a position 0.04 μm from the interface between the cured underlayer and the silicon oxide layer in the thickness direction, and preferably satisfies all of the following requirements ($a_3$) to ($c_3$) on the surface on the side opposite the interface:

($a_1$) when the chemical composition of the silicon oxide layer is represented by $SiO_xC_yH_z$, x is in the range of 1.93 to 1.98, y is in the range of 0.04 to 0.15, and z is in the range of 0.10 to 0.50.

($b_1$) the ratio of infrared absorbance at a wave number of 930 $cm^{-1}$ to that at a wave number of 1020 $cm^{-1}$ ($\alpha_{930}/\alpha_{1020}$) is in the range of 0.10 to 0.20, ($c_1$) the ratio of infrared absorbance at a wave number of 1280 $cm^{-1}$ to that at a wave number of 1020 $cm^{-1}$ ($\alpha_{1280}/\alpha_{1020}$) is in the range of 0 to 0.005, ($a_3$) when the chemical composition of the silicon oxide layer is represented by $SiO_xC_yH_z$, x is in the range of 1.94 to 2.02, y is in the range of 0.05 to 0.16, and z is in the range of 0.20 to 0.50, ($b_3$) the ratio of infrared absorbance at a wave number of 930 $cm^{-1}$ to that at a wave number of 1020 $cm^{-1}$ ($\alpha_{930}/\alpha_{1020}$) is in the range of 0.15 to 0.25, and ($c_3$) the ratio of infrared absorbance at a wave number of 1280 $cm^{-1}$ to that at a wave number of 1020 $cm^{-1}$ ($\alpha_{1280}/\alpha_{1020}$) is in the range of 0.002 to 0.020.

In ($a_1$) above, x is preferably in the range of 1.94 to 1.98, and is more preferably in the range of 1.95 to 1.97. Further, y is preferably in the range of 0.04 to 0.12, and is more preferably in the range of 0.04 to 0.07. Furthermore, z is preferably in the range of 0.11 to 0.30, and is more preferably in the range of 0.12 to 0.20. When x, y and z are within the above ranges, a dense silicon oxide layer which has sufficient adhesion with the cured underlayer is formed, whereby a layer in which cracks are unlikely to form in the silicon oxide layer during heat resistance tests is obtained, which is preferable.

In ($b_1$) above, ($\alpha_{930}/\alpha_{1020}$) is preferably in the range of 0.12 to 0.20, and is more preferably in the range of 0.13 to 0.19. When ($\alpha_{930}/\alpha_{1020}$) is within the above ranges, excellent adhesion to the substrate after various durability tests (high temperature constant humidity environment, heat cycle, and xenon weathering resistance tests) is demonstrated, which is preferable. The infrared absorbance α is represented by α=−Log(T/100) (where T is the infrared transmittance of the sample).

In ($c_1$) above, ($\alpha_{1280}/\alpha_{1020}$) is preferably in the range of 0 to 0.004, and is more preferably in the range of 0 to 0.003. When ($\alpha_{1280}/\alpha_{1020}$) is within the above ranges, boiling water resistance is suitable, which is preferable. Regarding the reason why the boiling water resistance is good within the above ranges, it is presumed that by including a small amount of an Si—$CH_3$ group in the silicon oxide layer obtained by PE-CVD, suitable flexibility is exhibited, whereby an effect of suppressing stress concentration within the layer is brought about.

In ($a_3$) above, x is preferably in the range of 1.94 to 2.00, and is more preferably in the range of 1.94 to 1.98. Further, y is preferably in the range of 0.05 to 0.14, and is more preferably in the range of 0.04 to 0.13. Furthermore, z is preferably in the range of 0.20 to 0.45, and is more preferably in the range of 0.21 to 0.40. When x, y, and z are within the above ranges, a highly rigid silicon oxide layer (hereinafter sometimes referred to as a high hardness layer) is formed, whereby a layer having sufficient abrasion resistance, and high hardness and heat resistance is formed, which is preferable.

In ($b_3$) above, ($\alpha_{930}/\alpha_{1020}$) is preferably in the range of 0.18 to 0.25, and is more preferably in the range of 0.19 to 0.25. When ($\alpha_{930}/\alpha_{1020}$) is within the above ranges, excellent heat resistance (heat resistance test for high temperature storage) is demonstrated, which is preferable.

In ($c_3$) above, ($\alpha_{1280}/\alpha_{1020}$) is preferably in the range of 0.002 to 0.015, and is more preferably in the range of 0.002 to 0.010, When ($\alpha_{1280}/\alpha_{1020}$) is within the above ranges, excellent heat resistance and excellent wear resistance and hardness can be obtained, which is preferable.

Note that y in ($a_3$) above may be greater than y in ($a_1$) by 0.02 or more. 0.03 or more, or 0.05 or more, and may be greater than y in ($a_1$) by 0.10 or less, 0.08 or less, 0.06 or less, or 0.04 or less. Furthermore, z in ($a_3$) above may be greater than z in ($a_1$) by 0.05 or more, 0.07 or more, 0.10 or more, or 0.15 or more, and may be greater than z in ($a_1$) by 0.25 or less, 0.20 or less, 0.15 or less, or 0.10 or less. By forming a gradient silicon oxide layer in this manner, excellent abrasion resistance is demonstrated, and heat resistance and durability are also satisfied, which is preferable. Furthermore, the absolute value of the difference between x in ($a_3$) above and x in ($a_1$) may be within the range of 0.05, 0.03, 0.02, or 0.01.

The ratio of ($b_3$) above may be greater than the ratio of ($b_1$) above by 0.05 or more, 0.07 or more, or 0.09 or more, and may be greater than the ratio of ($b_1$) above by 0.15 or less, 0.10 or less, 0.08 or less, 0.06 or less, or 0.04 or less, The ratio of ($c_3$) above may be greater than the ratio of ($c_1$) above by 0.001 or more, 0.003 or more, or 0.005 or more, and may be greater than the ratio of ($c_1$) above by 0.010 or less, 0.007 or less, 0.005 or less, or 0.003 or less.

(Thickness of the Silicon Oxide Layer)

The thickness of the silicon oxide layer of the present invention may be 0.1 μm or more, 0.2 μm or more, 0.3 μm or more, 1.0 μm or more, 3.0 μm or more, 5.0 μm or more, or 7.0 μm or more, and may be 9 μm or less, 8.5 μm or less, 8.0 μm or less, 6.0 μm or less, or 3.0 μm or less. Furthermore, the range of the thickness may be 0.1 μm to 9 μm, 0.2 μm to 9 μm, or 0.3 μm to 9

(When the Silicon Oxide Layer is Thick)

When the thickness of the silicon oxide layer is 2.5 μm or more, the silicon oxide layer preferably satisfies all of the following requirements ($a_2$) to ($c_2$) at a position 2.0 μm from the interface between the cured underlayer and the silicon oxide layer in the thickness direction:

($a_2$) when the chemical composition of the silicon oxide layer is represented by $SiO_xC_yH_z$, x is in the range of 1.81 to 1.90, y is in the range of 0.15 to 0.32, and z is in the range of 0.45 to 0.90, ($b_2$) the ratio of infrared absorbance at a wave number of 930 $cm^{-1}$ to that at a wave number of 1020 $cm^{-1}$ ($\alpha_{930}/\alpha_{1020}$) is in the range of 0.21 to 0.36, and ($c_2$) the ratio of infrared absorbance at a wave number of 1280 $cm^{-1}$ to that at a wave number of 1020 $cm^{-1}$ ($\alpha_{1280}/\alpha_{1020}$) is in the range of 0.010 to 0.040.

In ($a_2$) above, x is preferably in the range of 1.82 to 1.90, and is more preferably in the range of 1.85 to 1.90. Further, y is preferably in the range of 0.16 to 0.30, and is more preferably in the range of 0.17 to 0.29. Furthermore, z is preferably in the range of 0.45 to 0.80, and is more preferably in the range of 0.45 to 0.77. When x, y, and z are within the above ranges, since a silicon oxide layer having a moderate density (hereinafter sometimes referred to as a bulk layer) is formed, and it is possible for the silicon oxide layer to properly absorb the compressive/tensile stresses between layers due to differences in the coefficients of linear expansion of the layers during heat resistance tests, it is unlikely that adhesion between layers will be reduced or that cracks will be generated in the coat layer during environmental tests such as heat resistance tests and boiling water immersion tests. Furthermore, since the amount of reactive functional groups in the silicon oxide layer can be suppressed to within an allowable range, it is unlikely that cracking, a reduction in adhesion, a change in appearance (clouding), etc., will occur due to the reaction of the reactive functional groups during weather resistance tests, which is preferable.

In ($b_2$) above, ($\alpha_{930}/\alpha_{1020}$) is preferably in the range of 0.23 to 0.32, and is more preferably in the range of 0.25 to 0.30. When ($\alpha_{930}/\alpha_{1020}$) is within the above ranges, excellent heat resistance (heat resistance test for high temperature storage) is demonstrated, which is preferable.

In ($c_2$) above, ($\alpha_{1280}/\alpha_{1020}$) is preferably in the range of 0.012 to 0.030, and is more preferably in the range of 0.012 to 0.020. When ($\alpha_{1280}/\alpha_{1020}$) is within the above ranges, since the density of the formed silicon oxide layer is suitable, the compressive and tensile stresses between the layers can be properly absorbed during environmental tests such as heat resistance tests and boiling water immersion tests, and the silicon oxide layer is unlikely to be greatly deformed or broken, leaving indentation marks during indentation tests such as nanoindentation, which is preferable.

It is preferable that a gradient layer in which the values of the above chemical composition (x, y, and z) and the ratio of infrared absorbance ($\alpha_{930}/\alpha_{1020}$ and/or $\alpha_{1280}/\alpha_{1020}$) change gradually be arranged between the portion of the silicon oxide layer which satisfies all of requirements ($a_1$) to ($c_1$) (the initial dense layer) and the portion of the silicon oxide layer which satisfies all of requirements ($a_2$) to ($c_2$) (the bulk layer). By providing a gradient layer between the initial dense layer and the bulk layer, interfacial stresses between the layers can be suitably absorbed during heat resistance tests and weathering resistance tests, whereby durability can be improved, which is preferable.

Furthermore, it is preferable that a gradient layer in which the values of the above chemical composition (x, y, and z), and the ratio of infrared absorbance ($\alpha_{930}/\alpha_{1020}$ and/or $\alpha_{1280}/\alpha_{1020}$) change gradually be arranged between the portion of the silicon oxide layer which satisfies all of requirements ($a_2$) to ($c_2$) (the bulk layer) and the portion of the silicon oxide layer which satisfies all of requirements ($a_3$) to ($c_3$) (the high hardness layer). By providing a gradient layer between the bulk layer and the high hardness layer, interfacial stresses between the layers can be suitably absorbed during heat resistance tests and weather resistance tests, whereby durability can be improved, which is preferable.

The thickness of the portion which satisfies all of requirements ($a_1$) to ($c_1$) described above is preferably 0.04 μm to 0.4 μm, more preferably 0.04 μm to 0.2 μm, further preferably 0.04 μm to 0.10 μm, and especially preferably 0.04 μm to 0.07 μm. By setting the thickness to within this range, sufficient adhesion with the cured underlayer can be achieved, and a silicon oxide layer in which cracks are unlikely to occur during heat resistance tests can be formed, which is preferable.

The thickness of the portion which satisfies all of requirements ($a_2$) to ($c_2$) described above is preferably 1.5 µm to 8.5 µm, more preferably 2.0 µm to 7.0 µm, and further preferably 3.0 µm to 6.7 µm. By setting the thickness to within this range, adhesion is improved by compensating for the differences in the (linear) expansion (rate) between layers during heat resistance tests and boiling water tests, whereby the structure is unlikely to crack and the structure is unlikely to crack due to deformation thereof, which is preferable.

Furthermore, the thickness of the portion which satisfies all of requirements ($a_3$) to ($c_3$) described above is preferably present in the surface at a thickness of 0.1 µm to 1.4 µm, is more preferably present in the surface at a thickness of 0.2 µm to 1.2 µm, and is further preferably present in the surface at a thickness of 0.3 µm to 1.1 µm. By setting the thickness to within this range, wear resistance, heat resistance, and durability are improved, which is preferable.

(When the Silicon Oxide Layer is Thin)

The thickness of the silicon oxide layer of the present invention may be 2.5 µm or less, and may be, for example, 0.1 µm to 2.5 µm, 0.1 µm to 2.4 µm, 0.1 µm to 2.3 µm, 0.1 µm to 2.2 µm, 0.1 µm to 2.1 µm, or 0.1 µm to 2.0 µm, By satisfying the above requirements of the cured underlayer and requirements $a_1$ to $c_1$ and $a_3$ to $c_3$, even at such a thickness, a polymer substrate with a hard coat layer which is excellent in wear resistance, high hardness, and heat resistance can be achieved. As a result, another functional layer such as a UV blocking layer can be added in the space created by reducing the thickness of the polymer substrate with a hard coat layer, and the weight of the polymer substrate with a hard coat layer can be reduced.

A gradient layer in which the values of the above chemical composition (x, y, and z) and infrared absorbance rate ($\alpha_{930}/\alpha_{1020}$ and/or $\alpha_{1280}/\alpha_{1020}$) change gradually may be provided between the portion of the silicon oxide layer which satisfies all of requirements ($a_1$) to ($c_1$) (initial dense layer) and the portion of the silicon oxide layer which satisfies all of requirements ($a_3$) to ($c_3$) (high hardness layer). When a gradient layer is present between the initial dense layer and the high hardness layer, the stress at the interface between the layers can be absorbed to some extent during heat resistance tests and weathering tests, whereby durability is improved, which is preferable, (Optical Absorbance)

With respect to calculating absorbance, absorption spectrum is preferably measured by ATR for the surface on which is formed the silicon oxide layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ from the value on this absorbance spectrum from 650 cm$^{-1}$ to 1500 cm$^{-1}$.

$$\text{Baseline } \alpha_{B930} \text{ at a wave number of 930 cm}^{-1} = \alpha_{B930} = \alpha_{1330} + (\alpha_{1330}-\alpha_{1430})/100 \times (1330-930)$$
$$= \alpha_{1330} + (\alpha_{1330}-\alpha_{1430}) \times 4$$

$$\text{Baseline } \alpha_{B1020} \text{ at a wave number of 1020 cm}^{-1} = \alpha_{1330} + (\alpha_{1330}-\alpha_{1430})/100 \times (1330-1020)$$
$$= \alpha_{1330} + (\alpha_{1330}-\alpha_{1430}) \times 3.1$$

Here, the infrared absorbance at a wave number of 930 cm$^{-1}$ reflects the relative content of Si—OH groups, and as this value becomes larger following the formation of Si—OH groups by oxidative degradation of the raw material organic silicon compound during PE-CVD deposition, the dehydration condensation reaction thereof and the progression of crosslinking to the formation of a three-dimensional Si—O—Si network structure become inadequate, resulting in a relative decrease in thermal stability.

The ratio of infrared absorbance at a wave number of 1280 cm$^{-1}$ to that at a wave number of 1020 cm$^{-1}$ ($\alpha_{1280}/\alpha_{1020}$) of the silicon oxide layer obtained by PE-CVD of the present invention based on measurement of the infrared absorption spectrum of that layer is preferably within the range of 0.002 to 0.020. Here, infrared absorbance at a wave number of 1020 cm$^{-1}$ indicates the degree of formation of a three-dimensional Si—O—Si network structure, while the infrared absorbance at a wave number of 1280 cm$^{-1}$ reflects the relative content of Si—CH$_3$ groups in the silicon oxide layer obtained by PE-CVD.

With respect to calculating absorbance, absorption spectrum is preferably measured by ATR for the surface on which is formed the PE-CVD layer of the polymer substrate with hard coating layer over a wave number range from 650 cm$^{-1}$ to 1500 cm$^{-1}$. However, infrared absorbance $\alpha_K$ of each wave number is corrected by subtracting the following baseline values $\alpha_B$ equal from the value on this absorbance spectrum from 650 cm$^{-1}$ to 1500 cm$^{-1}$.

$$\text{Baseline } \alpha_{B1020} \text{ at a wave number of 1020 cm}^{-1} = \alpha_{1330} + (\alpha_{1330}-\alpha_{1430})/100 \times (1330-1020)$$
$$= \alpha_{1330} + (\alpha_{1330}-\alpha_{1430}) \times 3.1$$

$$\text{Baseline } \alpha_{B1280} \text{ at a wave number of 1280 cm}^{-1} = (\alpha_{1260}-\alpha_{1300})/2$$

(Maximum Indentation Depth as Determined by Nanoindentation)

In order to obtain suitable Taber abrasion resistance, the maximum indentation depth of the silicon oxide layer obtained by PE-CVD in nanoindentation measurement under conditions of a maximum test load of 1 mN is preferably 140 nm or less. This is because if the maximum indentation depth is greater than 140 nm, when contact abrasion between the silicon oxide layer obtained by PE-CVD and abrasive particles occurs, the indentation depth on the surface of the silicon oxide layer is relatively increased by the abrasive particles, and as a result, the depth of scratches (recesses generated by wear) increases, resulting in progression of the destruction of the layer.

The maximum indentation depth measured by nanoindentation under these conditions is more preferably 130 nm or less, and further preferably 120 nm or less. When the maximum indentation depth on the surface of a commercially available silicon wafer is measured under these conditions, the value is around 55 nm, and when the surface of a commercially available fused quartz plate is measured, the value is around 75 to 80 nm.

(Maximum Indentation Depth as Determined by Nanoindentation)

With respect to the hardness (abrasion resistance) of the silicon dioxide layer obtained by PE-CVD of the present invention, the silicon oxide layer obtained by PE. CVD preferably has high hardness in terms of obtaining superior Taber abrasion resistance, and indentation depth as determined by measuring nanoindentation under conditions of a maximum test load of 1 mN is preferably 4.5 GPa or more. This is because, in the case this layer has high hardness, the size of scratches caused by abrasive particles and the like can be reduced.

In addition, similar to measurement of maximum indentation hardness as previously described, measurement of nanoindentation is preferably carried out using the ENT-2100 Nanoindentation Hardness Tester manufactured by Elionix Inc. Furthermore, indentation hardness as determined by measuring nanoindentation under these conditions is preferably 5.0 GPa or more, more preferably 5.2 GPa or more and most preferably 6.0 GPa or more.

(Surface Roughness (Ra))

With respect to the compactness of the silicon oxide layer obtained by PE-CVD of the present invention and in terms of obtaining superior Taber abrasion resistance, the silicon oxide layer obtained by PE-CVD preferably has a compact fine structure, and surface roughness (Ra), as determined by measuring the surface of the silicon oxide layer in the dynamic force mode (DFM) of a scanning probe microscope under conditions of observing by 5.0 μm square is preferably 5.0 nm or less.

DFM is a measuring method that uses a scanning probe microscope that carries out measurement in a vibrational mode (dynamic force mode), and since it causes little abrasion with a sample surface and there is little effect of surface charging on measurements, it is effective for observing the surface of the silicon oxide layer obtained by PE-CVD which is frequently electrically insulated.

According to observing a surface by DFM, the silicon oxide layer obtained by PE-CVD undergoes vapor phase growth in the form of nanometer-sized fine particles, and a layer is formed of a form in which these fine particles accumulate on each other. Although surface roughness and surface area ratio of a layer surface are dependent on PE-CVD deposition conditions, a silicon oxide layer in which surface roughness measured under conditions of observing by 5 μm square is 5.0 nm or less demonstrates high layer compactness, is structurally stable, and is highly resistance to surface abrasion. If surface roughness exceeds 5.0 nm, fine particles undergoing vapor phase growth increase in size and layer compactness decreases resulting in a relatively sparse structure, thereby resulting in a decrease in resistance to surface abrasion, while there are also many cases in which an increase in haze value (ΔH) according to the conditions of the aforementioned Taber abrasion test exceeds 2%, thereby making this undesirable. In order to obtain even greater abrasion resistance, surface roughness is more preferably 4.0 nm or less and even more preferably 3.0 nm or less.

Furthermore, with respect to measuring surface roughness (Ra) and surface area ratio by DFM, since there are cases in which discrepancies occur attributable to the measuring device, cantilever used and measurement conditions, the SP13800N scanning probe microscope manufactured by Hitachi High-Tech Science Corp. is preferably used for the measuring device, the NSG10 manufactured by NT-MDT Corp. is preferably used for the cantilever, and measurement is preferably carried out under conditions of an observation area of a square measuring 5 μm on a side and measuring 256×256 measurement points. Measurements are preferably made in a plurality of regions followed by using the average value thereof, and in the present invention, measurements are carried out at 10 or more points.

(Average Deposition Rate)

The silicon oxide layer obtained by PE-CVD is preferably formed at a low average deposition rate (nm/sec) between the initial point of the start of deposition, such as the start of deposition, and 30 seconds or 60 seconds thereafter of deposition.

As a result of making this deposition rate to be low, the particle size of the silicon oxide layer obtained by PE-CVD formed (during initial deposition) in the vicinity of the interface with the cured underlayer can be reduced, and as a result thereof, a layer of high compactness is obtained. In addition, it is also possible to obtain time for the reaction degradation products of PE-CVD method to permeate into the cured underlayer, thereby enhancing the introduction rate of Si—O—Si bonds between layers and allowing the obtaining of an anchoring effect as previously described, If this deposition rate is too high, the particle size of the silicon oxide layer obtained by PE-CVD becomes relatively large, layer compactness decreases and adhesive strength with the cured underlayer tends to decreases, thereby making this undesirable. This deposition rate is more preferably 1.0 nm/sec or less, 0.8 nm/sec or less and even more preferably 0.6 nm/sec or less.

Furthermore, the amount of time required to deposit the layer at a low deposition rate is preferably within the range of 30 seconds to 180 seconds after the start of deposition. This is because, due to the high compactness and high flexibility of this layer, interfacial stress with the cured underlayer increases accompanying an increase in deposition time, namely an increase in layer thickness, thereby resulting in cases in which adhesive strength decreases. Deposition time is more preferably within the range of 30 seconds to 120 seconds and even more preferably within the range of 30 seconds to 90 seconds.

In order to ensure adhesion between the cured underlayer and silicon oxide layer by inhibiting increases in interface stress with the cured underlayer and to alleviate the effects of compressive stress and tensile stress caused by differences in coefficient of thermal expansion, the silicon oxide layer is preferably deposited at a low deposition rate over a prescribed amount of time followed by increasing the deposition rate. Increasing the deposition rate makes it possible to enhance productivity of silicon oxide layer deposition. The increased deposition rate in this case is for example, 2 nm/sec or more, 3 nm/sec or more, 4 nm/sec or more, 5 nm/sec or more, 7 nm/sec or more or 10 nm/sec or more.

Switching from a low deposition rate to a high deposition rate by changing the deposition rate continuously or incrementally in two or more steps is preferable since continuity is maintained between layers obtained at the low deposition rate and layers obtained at the high deposition rate, thereby inhibiting peeling.

(Plasma Generation Method)

In the PE-CVD method of the present invention, examples of methods used to generate plasma using excitation of decomposition and condensation reactions of the raw material silicon oxide compound include a method using a capacitive coupling type of plasma device that generates plasma in the space between parallel plates using opposing parallel plate electrodes, a method using an inductively coupled plasma device that generates plasma in the space within a coil using an electromagnetic coil, and a device that collides gas particles imparted with high energy by a plasma field onto a substrate surface by accelerating with injection pressure of an electromagnetic field by primarily using an inductively coupled plasma gun (and this includes atmospheric pressure plasma devices of this type).

Among these, a method using a capacitive coupling type of plasma device enabling superior stability and uniform control of plasma density is preferable. In particular, a device having a cooling mechanism provided with water or other coolant pipes within the electrodes and in which the electrode that holds and immobilizes the substrate is also provided with a heat sink function is preferable, and is preferably able to effectively carry out cooling (heat dissipation) of the substrate, which undergoes a rise in temperature as a result an influx of heat and so forth from the contact surface with high energy plasma, by holding and immobilizing the polymer substrate in a state in which it makes surface contact with one of the parallel plate electrodes.

In addition, in the case the polymer substrate has a three-dimensional or two-dimensional shape or a curved shape, the electrode having the aforementioned heat sink function is preferably preliminarily processed into a shape that matches the shape of the polymer substrate so as to afford surface contact therewith. In addition, metal attachments having various shapes corresponding to the shape of each substrate are processed and prepared so as to be able to adapt to numerous types of substrate shapes, and can preferably be attached and removed corresponding to substrate shape.

Furthermore, a material that is resistant to corrosion and degenerative corrosion attributable to plasma is preferable for the material of the metal used for the electrodes, and examples thereof include stainless steel (SUS) and aluminum.

In a capacitive coupling type of plasma device, an external electrode type, in which high-frequency electrodes are installed outside the vacuum chamber (reaction vessel), or an internal electrode type, in which high-frequency electrodes are installed inside the vacuum chamber (reaction vessel), can be used.

Although a high-frequency power supply is used to input high-frequency electrical power, the frequency thereof is a frequency designated as an industrial frequency band according to the Radio Act, and although examples thereof include frequencies of 13.56 MHz, 27.12 MHz, 40.68 MHz, 85 MHz. 2.45 GHz. 5.8 GHz and 22.125 GHz, that having a frequency of 13.56 MHz can be used most commonly.

Although the applied power during input of high-frequency electrical power (to be referred to as high-frequency applied power) varies according to the type of raw material used and size of the PE-CVD device (size of the substrate), it is generally about 50 W to 10000 W. However, since many commercially available, commonly used power supplies have an applied power of 5000 W or less, input electrical power is preferably controlled to 5000 W or less.

Furthermore, although the high-frequency applied power is preferably applied continuously, a portion thereof may also be applied in the form of intermittent pulses as necessary.

The degree of vacuum of the vacuum chamber (reaction vessel) in terms of the ultimate vacuum of the vacuum chamber (reaction vessel) prior to carrying out each step is preferably $10^{-2}$ Pa or less and more preferably $10^{-3}$ Pa or less. In addition, the degree of vacuum when forming the silicon oxide layer by PE-CVD or during plasma treatment is preferably 20 Pa or less and more preferably 10 Pa or less from the viewpoints of stable continuation of plasma and ensuring uniformity, and is preferably typically $1 \times 10^{-2}$ Pa or more.

(Deposition Raw Materials and Conditions)

Organic silicon compounds containing a carbon atom or organic silicon compounds containing a carbon atom, oxygen atom or nitrogen atom are preferable for the raw material organic silicon compound used during formation of the silicon oxide layer by PE-CVD, and more specifically, an organosiloxane, organosilane or (organo)silazane and the like can be used preferably.

Specific examples of organic silicon compounds that can be used include tetramethoxysilane, vinyltrimethoxysilane, octamethylcyclotetrasiloxane, tetraethoxysilane, hexamethylcyclotrisiloxane, octamethyltrisiloxane, hexamethyldisiloxane, hexaethyldisiloxane, hexaethylcyclotrisiloxane, tetramethylsilane, 1,1,3,3-tetramethyldisiloxane, 1,1,3,3-tetramethyldisilazane, pentamethyldisiloxane, hexamethyldisilazane, heptamethyldisilazane, 1,3-dimethoxytetramethyldisiloxane, 1,3-diethoxytetramethyldisiloxane, hexamethylcyclotrisilazane. 1,1,3,3,5,5-hexamethyltrisiloxane, 1,1,1,3,5,5,5-heptamethyltrisiloxane, 1,3,5,7-tetramethylcyclotetrasiloxane, 1,1,1,3,5,7,7,7-octamethyltetrasiloxane, 1,1,3,3,5,5,7,7-octamethylcyclotetrasilazane, 1,3,5,7-tetramethylcyclotetrasiloxane, tris(trimethylsiloxy)silane and tetramethyltetrasiloxane.

One type of these organic silicon compounds can be used alone or two more types can be used in combination. In addition, a gas such as oxygen, nitrogen, argon, helium or hydrogen (to be referred to as carrier gas) is preferably used in combination for the purpose of promoting decomposition and condensation of these organic silicon compounds in a gaseous plasma composition or control the chemical composition of the silicon oxide layer formed (represented by SiOxCyHz). The organic silicon compound and carrier gas can be preliminarily mixed and then supplied to the vacuum reaction vessel of the plasma polymerization device, or can be separately supplied to this vacuum reaction vessel and then mutually mixed therein.

In the case of using oxygen for the carrier gas, although the ratio of oxygen to organic silicon compound cannot be universally defined since it varies according to the type of organic silicon compound used and desired chemical composition and film thickness of the silicon oxide layer, it is suitably selected from a range of about 5 times to 500 times, and more preferably about 10 times to 100 times, the volume of a water vapor of the organic silicon compound.

Although it is difficult to universally define a preferable range for the gas flow rate, high-frequency applied power and distance between electrodes during deposition since they are dependent on such factors as the areas of the substrate and electrodes, volume of the vacuum chamber and shape of the substrate, in the case of, for example, a flat substrate and converting to a substrate area in square meters, the total gas flow rate combining the raw material organic silicon compound and the carrier gas is generally within the range of about 1000 sccm to 5000 sccm, the high-frequency applied power is preferably controlled to within a range of about 2 KW to 7 KW and more preferably 3 KW to 5 KW, and the distance between electrodes is preferably controlled to about 80 mm to 300 mm.

Deposition time of the silicon oxide layer is preferably within the range of about 1 minute to 30 minutes, more preferably about 2 minutes to 20 minutes, and even more preferably about 3 minutes to 10 minutes. Furthermore, deposition can be divided into separate deposition times as necessary mutually partitioned with a partition wall, or deposition may be carried out separately in a plurality of vacuum chambers capable of being interconnected by an inline system and the like.

In addition, in the silicon oxide layer deposition step, the flow rates of the raw material organic silicon compound and carrier gas and/or the high-frequency applied power and frequency and the like are preferably changed over time as necessary. Each flow rate, high-frequency applied power and frequency may be changed independently or simultaneously.

Figure 1:
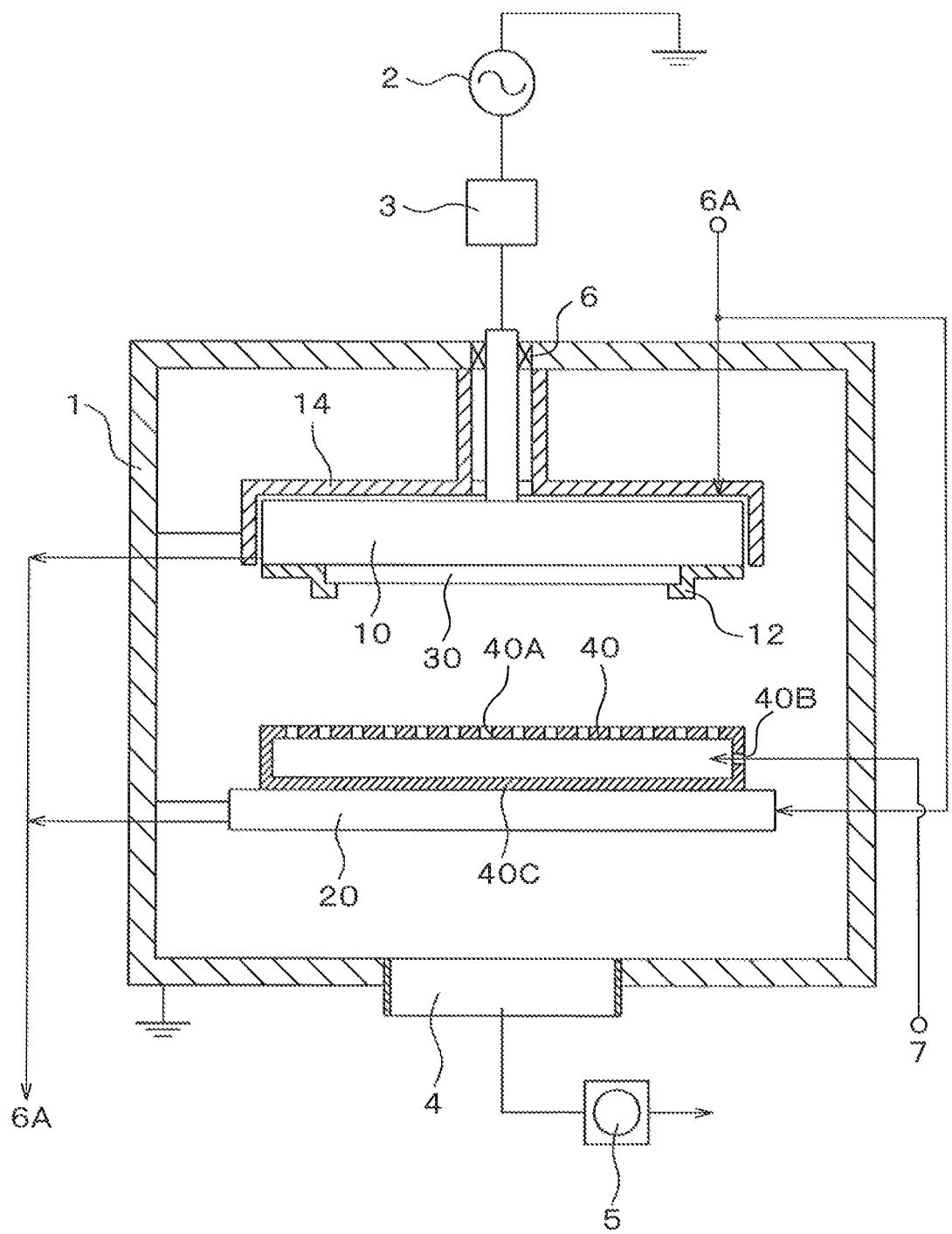
FIG. 1 is a schematic diagram of one example of a capacitive coupling type of PE-CVD device able to be used to form the silicon oxide layer of the present invention by PE-CVD.

FIG. 1 shows one example of a capacitive coupled type of CVD device able to be preferably used to form the polymer substrate with hard coating layer of the present invention. Furthermore, in this drawing, although a first electrode 10, a second electrode 20, a treated substrate 30 and an introducing head 40 are arranged in the vertical direction, they can also be arranged in a row in the horizontal direction.

In the example shown in this drawing, the first electrode (cathode electrode) 10 and the second electrode (anode electrode) 20 are arranged in mutual opposition within a vacuum vessel. A treated substrate in the form of a polymer substrate 30 is arranged on the surface of the first electrode 10 and supported by a holder 12. The inside of the vacuum vessel 1 is reduced in pressure by a vacuum pump 5 through an exhaust port 4, and while reaction gas 7 is introduced into the vacuum vessel 1 though the introducing head 40 from the outside, plasma of the reaction gas is formed between the first electrode (cathode electrode) 10 and the second electrode (anode electrode) 20.

The first electrode (cathode electrode) 10 is connected to a power supply 2 through a matching box 3. The first electrode 10 is insulated from the vacuum vessel 1 by an insulating seal 6. In addition, although not in detail in the drawing, a cooling medium 6A flows through the first electrode (cathode electrode) 10, and the polymer substrate 30 is cooled by cooling and dissipating heat through the interface between the first electrode 10 and the polymer substrate 30. Moreover, a shielding component 14 is provided at a slight interval on the outer periphery of the first electrode (cathode electrode) 10 with the exception of the surface opposing the second electrode (anode electrode) 20. In addition, the second electrode (anode electrode) 20 is grounded.

Figure 3:
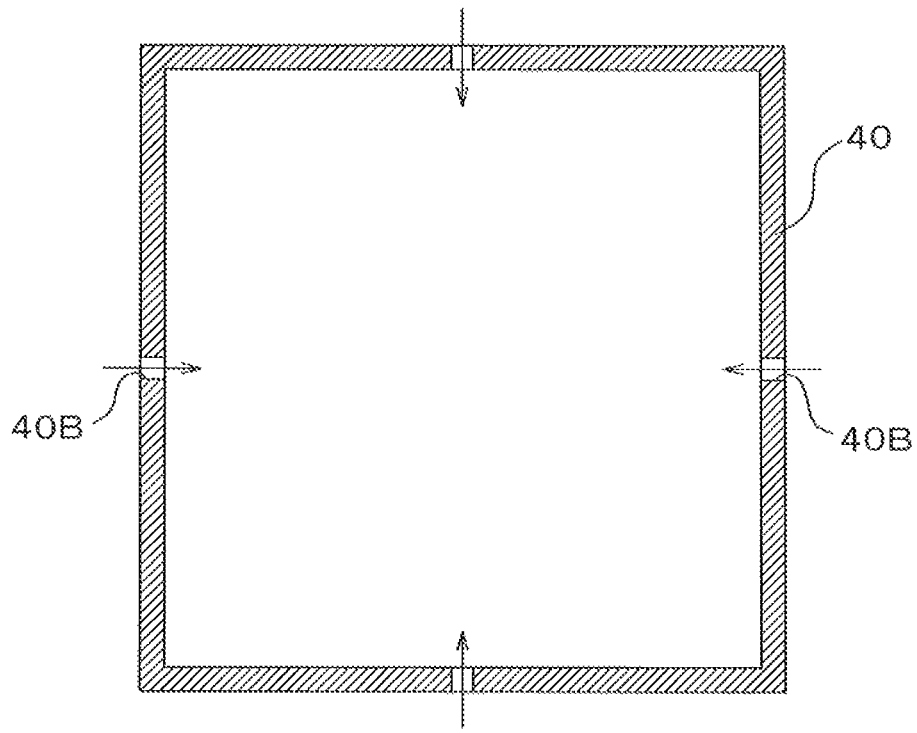
FIG. 3 shows an example of a reactive gas introducing head provided on an electrode in a capacitive coupling type of PE-CVD device able to form the silicon oxide layer of the present invention by PE-CVD, with (a) depicting a horizontal cross-sectional view and (b) indicating the arrangement (example) of a large number of gas blowout holes provided in a surface on the side opposing a treated substrate.
Figure 3:
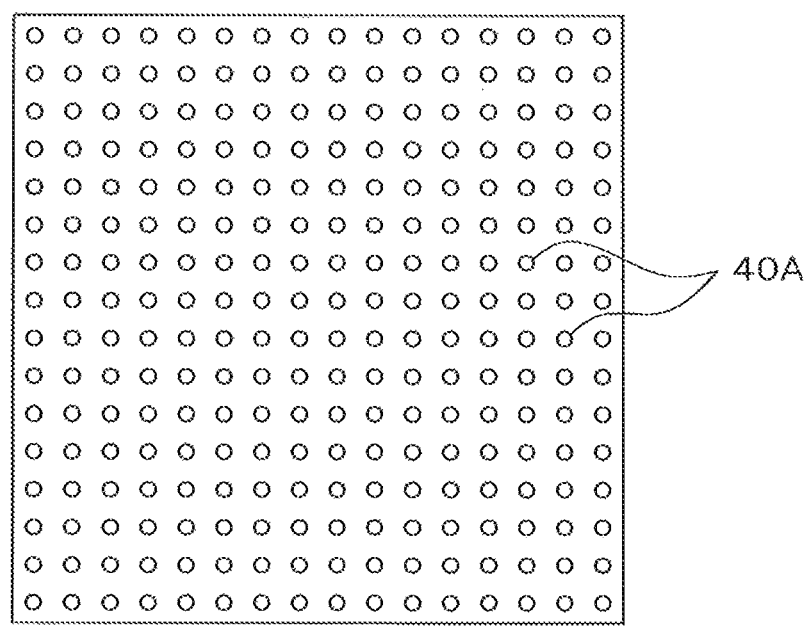

In the example shown in this drawing, a box-shaped introducing head 40 for introducing the reaction gas 7 is provided between the treated substrate in the form of the polymer substrate 30 and the second electrode (anode electrode) 20. As indicated with one example of the shape thereof in FIG. 3, the introducing head 40 has a large number of gas blowout holes 40A in the wall surface on the side opposing the first electrode (cathode electrode) 10, and the reaction gas 7 is introduced into the introducing head 40 through inlets 40B. The introducing head 40 is configured so that the reaction gas 7 that has been introduced into the introducing head 40 is blown out from the blowout holes 40A onto a side of the first electrode (cathode electrode) 10, namely towards the polymer substrate 30 held on the surface of the first electrode (cathode electrode) 10.

Although the introducing box is preferably in the shape of a flat box, the specifications thereof are not limited to those shown in the drawing, but rather the shape of the box and the shape, size, formation density, interval or distribution and the like of the blowout holes 40A can be adjusted as desired according to the shape and dimensions of the treated substrate in the form of the polymer substrate 30. However, in the case of a large number of the blowout holes 40A, the introducing head is preferably circular having a diameter of about 2 mm to 7 mm, and the interval between holes (pitch) is preferably about 4 mm to 20 mm.

In the case the polymer substrate has a two-dimensional, three-dimensional or curved shape, the space between the polymer substrate and the electrode on which the polymer substrate is held and immobilized preferably ensures surface adhesion whenever possible, and a gap is preferably prevented from being formed between the two. This is due to the need for cooling the polymer substrate, plasma uniformity and stability, and if a prominent gap is present, there are many cases in which problems such as a significant rise in the temperature of the polymer substrate or the occurrence of abnormal discharge in the plasma space are actualized, thereby making this undesirable. Thus, at least the shape of the electrode on the side on which the polymer substrate is held and immobilized preferably matches the shape of the polymer substrate and is formed to a similar shape.

Figure 2:
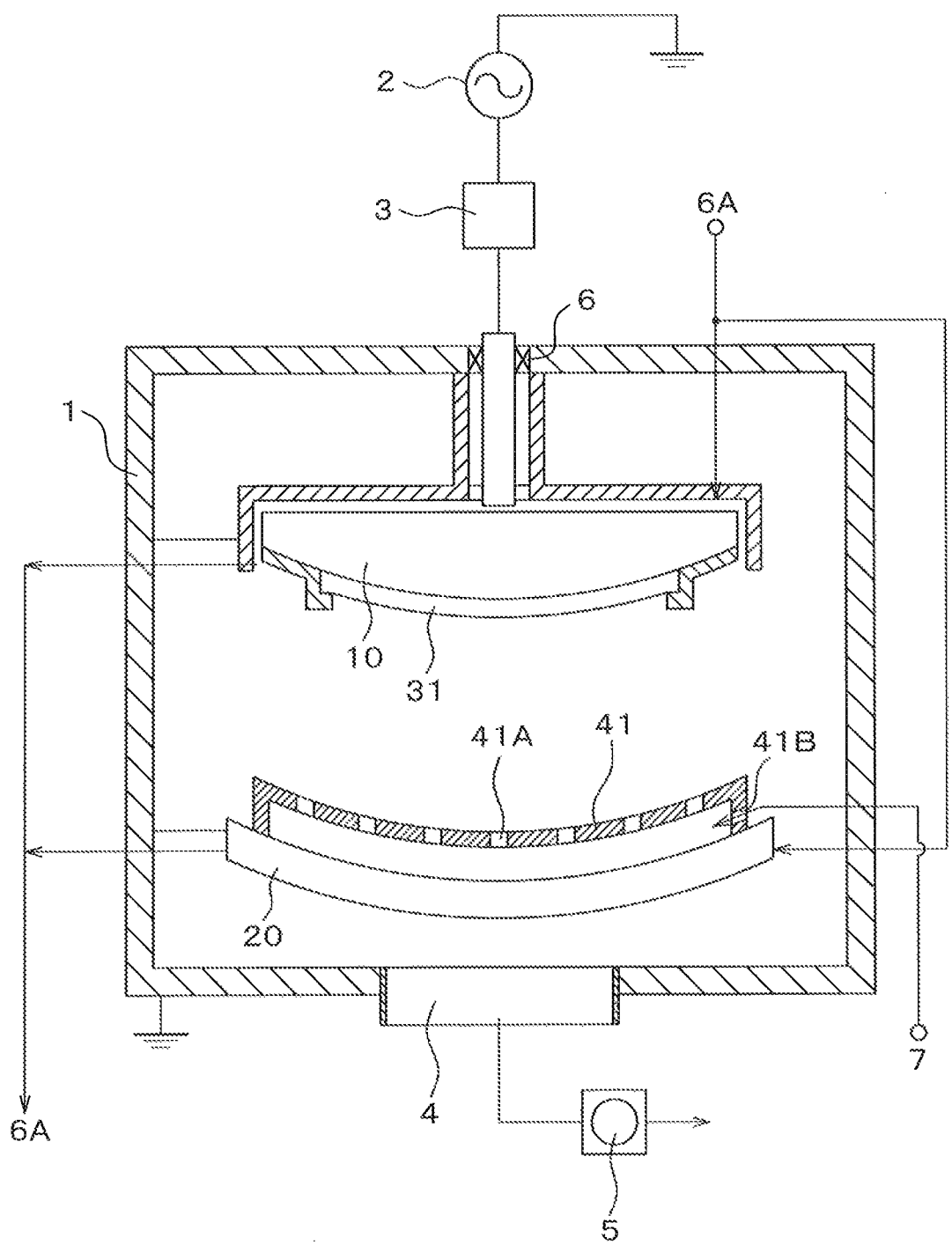
FIG. 2 is a schematic diagram of another example of a capacitive coupling type of PE-CVD device able to be used to form the silicon oxide layer of the present invention by PE-CVD.

FIG. 2 shows another example of a capacitive coupled type of CVD device that can be preferably used to form the polymer substrate with hard coating layer of the present invention, and indicates an example of the specifications of a preferable device in the case the treated substrate in the form of the polymer substrate 30 has a curved shape.

In the example shown in this drawing, the first electrode (cathode electrode) 10, the second electrode (anode electrode) 20 and an introducing head 41 each have a curved shape similar to the curved shape of a polymer substrate 31. In the case of adopting such a configuration, the density distribution of the reaction gas 7 and the uniformity of the distribution of high-frequency electrical power (spatial electrical field, spatial current) are enhanced in the plasma reaction space interposed between the polymer substrate 30 on the first electrode (cathode electrode) 10 and the introducing head 41 on the second electrode (anode electrode) 20, thereby making this preferable.

<Lamination of Functional Layers>

In the polymer substrate with hard coating layer of the present invention, a functional layer such as fouling prevention layer or antistatic layer may be further laminated on a surface layer, electrically conductive layer or silicon oxide layer obtained by PE-CVD formed on an infrared absorbing/reflecting layer on one side or both sides thereof as necessary.

A fouling prevention layer is a layer having a function that inhibits the adhesion of fingerprints or dirt to the silicon oxide layer obtained by PE-CVD or the formation of scale based on long-term use in an outdoor environment, and is a layer having an effect that continuously enhances surface water repellency, oil repellency, hydrophilicity or lipophilicity over a long period of time according to the particular objective. This layer is preferably formed into a thin film having a thickness of several nanometers to several hundred nanometers, and specific examples of the effects thereof include water repellency and/or oil repellency demonstrated by a layer obtained by decomposing and condensing a silicon compound having a fluoroalkyl group, and hydrophilicity and/or lipophilicity demonstrated by a titanium oxide layer, zinc oxide layer, niobium oxide layer or cerium oxide layer. With respect to the latter hydrophilic and/or lipophilic layer in particular, in the case of a layer having a photocatalytic function that acts as an oxidation-reduction catalyst when excited by ultraviolet light or light in the visible light region, a self-cleaning effect is obtained that enables dirt adhered to the outermost surface to be degraded and washed off due to the combined actions of sunlight and rain in an outdoor environment, thereby making this preferable.

In addition, examples of an antistatic layer (layer having electrical conductivity) include transparent electrically conductive layers (such as ITO or IZO) composed of metal oxides having indium oxide, tin oxide or zinc oxide and the like as a main component thereof, and transparent electrically conductive layers obtained by dispersing an electrically conductive material such as a metal, metal oxide or carbon in a layer obtained by hydrolytic condensation of an organic silicon compound, In addition, examples of an electrically conductive layer include a layer obtained by printing the aforementioned transparent electrically conductive layer, an electrically conducive paste obtained by dispersing silver, copper or other metal fine particles having superior electrical conductivity in a resin binder, and a layer formed by mechanically punching out a metal thin plate or metal foil or forming an electrically conductive pattern by chemical etching, and can also be used as a heating layer based on the application of current to the electrically conductive layer (in order to remove fogging or frost caused by water vapor having condensed on a laminate surface) or as an antenna for transmitting and receiving radio waves or as an electromagnetic wave shielding layer.

Furthermore, the antistatic layer or electrically conductive layer are not necessarily required to be formed on the outermost surface, but rather may be formed on the polymer substrate, adhesive layer or cured underlayer and the like, and the adhesive layer and/or cured underlayer and/or silicon oxide layer obtained by PE-CVD may be further laminated following the formation thereof. In addition, the electrically conductive layer may be integrally formed with the polymer substrate when molding the polymer substrate by a method such as insert molding or in-mold transfer.

<Annealing of Polymer Substrate with Hard Coating Layer>

The polymer substrate with hard coating layer of the present invention may be further subjected to thermal annealing as necessary for the purpose of relieving internal strain and further promoting crosslinking and curing of each laminated layer after the silicon oxide layer obtained by PE-CVD has been laminated as necessary. Although annealing treatment may be carried out at vacuum pressure or normal pressure, it is generally preferably carried out within the range of 60° C. to 130° C. Although varying according to the treatment temperature, treatment time is preferably roughly 10 minutes to 48 hours.

<Method for Preparing Polymer Substrate with Hard Coating Layer>

In the polymer substrate with hard coating layer of the present invention, according to the target application as previously described, a silicon oxide layer is formed on a surface layer on one or both sides using PE-CVD capable of forming a hard coating layer having high hardness similar to that of inorganic glass so that the increase in haze value (ΔH) on a surface laminated with the hard coating layer is 2% or less in a Taber abrasion test using a CS-10F abrading wheel at a load of 4.9 N and test rotating speed of 1000 revolutions.

<Haze Value of Polymer Substrate with Hard Coating Layer>

The initial haze value (referring to prior to carrying out an abrasion resistance test or environmental resistance test and the like) of the polymer substrate with hard coating layer of the present invention is preferably 1.0% or less, more preferably 0.8% or less and even more preferably 0.6% or less in the case of using in an application requiring a high level of visibility such as an automobile window. This is because, if the haze value exceeds 1.0%, images seen there through become indistinct resulting in cases in which this presents a problem in terms of driving (safety standards for automobile window materials may require a haze value of 1.0% or less depending on the country).

<Visible Light Transmittance of Polymer Substrate with Hard Coating Layer>

Visible light transmittance of the polymer substrate with hard coating layer of the present invention is preferably 70.0% or more in the case of using in an application requiring a high level of visibility such as an automobile window. Here, visible light transmittance refers to the transmittance of all light in the visible wavelength range with respect to a C light source or D65 light source, and although varying according to the application, is generally more preferably 75% or more, even more preferably 80% or more and most preferably 85% or more.

Furthermore, the polymer substrate with hard coating layer of the present invention may also be colored as necessary, and can be colored green, gray or various other colors. Although this coloring is typically carried out by suitably mixing pigments or dyes, these pigments or dyes may be mixed into the polymer substrate or mixed into a coating layer laminated on the polymer substrate.

<Accelerated Weather Resistance of Polymer Substrate with Hard Coating Layer>

The polymer substrate with hard coating layer of the present invention preferably demonstrates a prescribed level of performance or better in an accelerated weather resistance test as related to resistance to the external environment (such as with respect to ultraviolet light, temperature changes or humidity changes and the like) over a long period of time. More specifically, in the case of carrying out an exposure test for 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., there are no decreases in appearance or adhesion observed, and the duration is more preferably 10000 hours or more.

<Abrasion Resistance of Polymer Substrate with Hard Coating Layer>

With respect to abrasion resistance comparable to that of inorganic glass, required abrasion resistance for windows used at sites requiring visibility during driving with reference to, for example, U.S. safety standard FMVSS205 or European safety standard ECE $R_{43}$ is an increase in haze value (ΔH) of less than 2% and/or 2% or less as determined by a Taber abrasion test carried out for 1000 revolutions in accordance with ASTM D1044.

<Boiling Water Resistance and Adhesion of Polymer Substrate with Hard Coating Layer>

An adhesion test was carried out according to the crosscut tape method in compliance with JIS K5400 after immersing the polymer substrate with hard coating in boiling water at 100° C. and retaining in the boiling water for 3 hours followed by removing from the boiling water, removing any adhered moisture, and allowing to stand in a room temperature environment for 2 hours. The crosscut tape test is carried out by forming 10×10 squares cut out at 1 mm intervals with a cutter knife in the form of a grid followed by affixing and adhering tape having a prescribed adhesive force (such as Nichiban Cellophane Tape™) and then peeling off the tape. The result for adhesion immediately after carrying out the crosscut tape test (state in which the layer is peeled or separated from the surface) was designated as the "initial result", while the result obtained after the passage of 7 days after carrying out the crosscut tape test was designated as the "elapsed result", and adhesive performance and the reliability thereof were judged to be favorable only in the case not only the "initial result", but also the "elapsed result" was favorable.

This is because there are many cases in which internal stress (and frequently compressive force) generated during layer formation remains in the silicon oxide layer obtained by PE-CVD, and due to the action thereof, there are cases observed in which layer separation is observed to occur over time. On the basis thereof, in terms of ensuring long-term reliability of environmental resistance of the polymer substrate with hard coating layer of the present invention, both a favorable "initial result" and a favorable "elapsed result" are required.

EXAMPLES

The following clarifies the effects of the present invention while indicating examples and comparative examples thereof.

Furthermore, although examples of the silicon oxide layer obtained by PE-CVD being laminated only on one side of the surface layer are indicated in the present examples and comparative examples, a configuration in which the silicon oxide layer is laminated on both sides, may also be preferably carried out without incident.

[Evaluation Methods]

Various evaluations in the examples and comparative examples were carried out according to the methods indicated below.

<Measurement of Chemical Composition of Silicon Oxide Layer>

The chemical composition of the surface of the structure was measured by performing X-ray photoelectron spectroscopy (XPS) measurement on the surface of the silicon oxide layer. The calibration curve was created by performing XPS measurement on a dimethyl silicone rubber. Regarding samples of the polymer substrate with a hard coat layer, in which the silicon oxide layer was partially exposed by compressive stress in a bending test, the surface of the silicon oxide layer was polished with a polishing agent using fine diamond particles to prepare a sample in which polishing progressed to 2 μm and 0.04 μm from the interface with the cured underlayer, and thereafter, XPS measurement was performed to determine the chemical composition of the silicon oxide layer. The thickness of the silicon oxide layer was determined by performing contact measurement of a step, optical measurement (focal length measurement), cross-sectional SEM measurement, refractive index measurement, interference film thickness measurement, or the like.

<Measurement of Infrared Absorbance Rate>

ATR-IR measurement was performed on the surface a sample of the polymer substrate with a hard coat layer using a zirconium sensor to measure the ratio of infrared absorbance of the silicon oxide layer. Furthermore, the surface of the silicon oxide layer was polished with a polishing agent using fine diamond particles, to prepare a sample in which the polishing progressed to 2 μm and 0.04 μm from the interface with the cured underlayer, and likewise, ATR-IR measurement was carried out.

<Measurement of Maximum Indentation Depth, Indentation Hardness and Depression Elastic Modulus by Nanoindentation>

Maximum indentation depth ($h_{max}$), indentation hardness ($H_{IT}$) and indentation elastic modulus ($E_{IT}$) were determined by measuring a loading and unloading curve (force curve) under conditions of a maximum load of 1 mN, load steps of 4 μN, 250 step divisions, loading time of 20 sec, unloading time of 20 sec and maximum load retention time of 0.4 sec using the ENT-2100 Nanoindentation Hardness Tester manufactured by Elionix Inc. and a triangular pyramidal indenter having an apex angle of 65 degrees (crest interval: 115 degrees), followed by calculating in compliance with 15014577-1 2002-10-01 Part 1 (using device internal software). Furthermore, measurements were carried out at 10 different locations followed by taking the average value thereof.

Furthermore, since the shape of the end of the triangular pyramidal indenter changes due to variations in the processing thereof and wear caused by use thereby resulting in variations and uncertainty in measured values, confirmatory work or corrective work is preferably carried out prior to measuring samples.

Confirmatory work is carried out by measuring a commercially available silicon wafer under the aforementioned test conditions, confirming that maximum indentation depth is within the range of 55±3 nm, and replacing the triangular pyramidal indenter with a new one in the case of outside that range (this method is employed in the case of measuring using the ENT-1100 tester manufactured by Elionix Inc.). The results of this test are used as one aspect for evaluating the abrasion resistance.

In addition, corrective work can be carried out by measuring a fused quartz plate as a reference sample and calculating the value with internal software of the aforementioned tester (due to the configuration of the software, this method can only be used in the of measuring using the ENT-2100 tester manufactured by Elionix Inc.).

<Measurement of Surface Roughness (Ra) and Specific Surface Area Using Scanning Probe Microscope with Dynamic Force Mode (DFM)>

Surface roughness (Ra) and surface area ratio were determined by measuring using the SPI3800N scanning probe microscope manufactured by SII Nanotechnology Inc. (and distributed by Hitachi High-Tech Science Corp.) and the NSG10 silicon cantilever (equipped with a tip having a radius of curvature of about 10 nm) for the cantilever under conditions of a measuring range of 5 μm×5 μm in the vertical and horizontal directions, measuring 256×256 measurement points and a scanning frequency of 1 kHz followed by calculating the results with device internal software. Furthermore, measurements were carried out at 10 different locations followed by taking the average value thereof.

Here, surface roughness (average surface roughness, Ra) is a value obtained by averaging the absolute value of the difference of height from a reference surface to a designated surface (Z coordinate). Here, the reference surface is a surface containing the average value of the Z coordinates of all measurement points, while the designated surface is a surface that connects the Z coordinates of all measurement points (having for a unit surface thereof a triangle formed by connecting the closest 3 points).

In addition, surface area ratio is the ratio of the area of the designated surface (measurement surface) to the area of the reference surface (flat surface where Z coordinates are constant).

<Measurement of Film Thickness>

The film thickness of each layer is preferably measured by according to a known optical interference method based on the optical interference pattern appearing in the transmission spectrum or reflection spectrum measured over a wavelength range of, for example, 450 nm to 650 nm and the refractive index of each layer. However, in the case of an absence of any difference in the refractive index of each layer or in the case the optical interference pattern is ambiguous due to the presence of disturbances (surface irregularities) in a layer interface thereby making measurement difficult, an alternative measurement method may be employed that is based on observing the cross-section of the polymer substrate with hard coating layer with a scanning electron microscope. In either case, measurements are carried out at 5 different locations followed by taking the average value thereof. Furthermore, the refractive index of each layer is measured with an Abbe refractometer and the like.

<Appearance Evaluation>

The surface of the polymer substrate with hard coating layer having a silicon oxide layer obtained by PE-CVD was observed visually to confirm the presence or absence of cracks.

<Adhesion>

100 crosscuts were made at an interval of 1 mm with a cutter knife in the surface of the polymer substrate with hard coating layer having a silicon oxide layer obtained by PE-CVD followed by repeating three times a procedure consisting of adhering Nichiban adhesive tape thereto and forcibly peeling off the tape while pulling in the perpendicular direction and then evaluating adhesion in terms of the number of squares remaining on the substrate (in compliance with JS K5400).

<Measurement of Total Light Transmittance and Haze Value>

Haze value was measured using the NDH2000 Haze Meter manufactured by Nippon Denshoku Industries Co., Ltd. Furthermore, haze value (II) is represented by H Td/ftx 100 (Td: diffuse light transmittance, Tt: total light transmittance).

<Taber Abrasion Resistance Test>

The surface of the polymer substrate with hard coating layer having a silicon oxide layer obtained by PE-CVD was evaluated by abrading the surface of an abrading wheel using the CS-10F abrading wheel manufactured by Taber Industries Inc, as one aspect for evaluating the abrasion resistance. for 25 revolutions with the ST-11 grindstone manufactured by Taber Industries Inc. prior to testing, followed by carrying out a Taber abrasion test for 1000 revolutions at a load of 500 g and measuring the change in haze value ($\Delta H$) before and after the Taber abrasion test (in compliance with ASTM D1044).

Measurements were carried out on three test pieces having the same specifications, and the average value thereof was used as the performance value of the sample. Furthermore, the abrasion test was carried out after confirming that the abrading wheel used in the test demonstrated a change in haze value ($\Delta H$) within the range of 0.6% to 1.0% in the case of having carried out the Taber abrasion test for 1000 revolutions by the same method on commercially available float glass (plate glass), and abrading wheels that were outside this range were not used in testing.

<Boiling Water Resistance>

A test piece of the polymer substrate with hard coating layer cut to a size of 60 mm×120 mm was immersed in boiling water at 100° C. followed by removing from the boiling water after bolding therein for 3 hours, removing any adhered moisture, and allowing to stand in a room temperature environment for 2 hours followed by confirming any appearance and testing adhesion of the surface of the polymer substrate with hard coating layer having a silicon oxide layer obtained by PE-CVD.

Appearance was evaluated by confirming layer separation, formation of cracks, color tone and the presence or absence of changes in haze value.

Adhesion was evaluated by carrying out a crosscut tape test in compliance with JIS K5400, and after having formed 10×10 squares cut out at 1 mm intervals with a cutter knife in the form of a grid, tape having a prescribed adhesive force (such as Nichiban Cellophane Tape™) was affixed and adhered and then peeled off.

Furthermore, the appearance (status of layer peeling or lifting) immediately after carrying out testing (after having removed the test piece from boiling water, removed any adhered water, and allowed to stand for 2 hours in a room temperature environment) was designated as the "appearance", adhesion was designated as "adhesion", and the result obtained after the passage of 7 days after carrying out the test was designated as the "elapsed result". Furthermore, elapsed result was assessed as favorable (A) in the case of no changes from the result obtained immediately after testing, while elapsed result was assessed as poor (D) in the case a portion of the hard coating layer had separated spontaneously from the substrate starting at mainly those locations where the substrate had been cut with the cutter knife in order to evaluate adhesion. The polymer substrate with hard coating layer of the present invention was required to demonstrate favorable results for all of "appearance", "adhesion" and "elapsed results". Furthermore, the size of the test pieces was that which enabled testing to be carried out even if different from that indicated above.

<Heat Resistance>

A test piece of the polymer substrate with hard coating layer cut to a size of 60 mm×120 mm was held in a constant temperature tank at 110° C. or 130° C. followed by evaluating appearance changes and adhesion of the polymer substrate with hard coating layer having a silicon oxide layer obtained by PE-CVD 1000 hours later.

Further, as in the boiling water resistance, the result obtained after the passage of 7 days after carrying out the test was designated as the "elapsed result".

<Accelerated Weather Resistance>

An exposure test was carried out for 2000, 4000, or 8000 hours under conditions consisting of UV irradiation intensity of 180 W/m$^2$, black panel temperature of 63° C. and rainfall for 18 of 120 minutes using the SX-75 Suga Xenon Weather Meter manufactured by Suga Test Instruments Co., Ltd., and after removing the test piece and gently scrubbing the surface of the polymer substrate with hard coating layer having a silicon oxide layer obtained by PE-CVD with a sponge soaked with a neutral detergent, the test piece was evaluated for appearance, adhesion, and changes in color ($\Delta E$) before and after testing, (Method for Preparing Precursor Material Liquid of Cured Underlayer)

<Preparation of Surface-Coated Colloidal Silica Liquid Dispersion (A')>

12 parts by weight of acetic acid were added to 81.2 parts by weight of a water-dispersible colloidal silica liquid dispersion (Cataloid SN-30, particle diameter approx. 17 nm, solid content concentration: 30% by weight, manufactured by Catalysts and Chemicals Industry Co., Ltd.) and stirred followed by the addition of 128.8 parts by weight of methyltrimethoxysilane to this liquid dispersion while cooling in an ice bath. After stirring this mixture for 90 minutes at 30° C. the reaction liquid stirred for 8 hours at 60° C. was cooled with ice water after which 2 parts by weight of a curing catalyst in the form of sodium acetate were mixed therein while cooling with ice water to obtain a surface-coated colloidal silica liquid dispersion (A').

<Preparation of Cured Underlayer Raw Material (A1)>

164 parts by weight of methoxypropanol were added to a reaction vessel followed by raising the temperature to 80° C., dropping in a mixture containing 40 parts by weight of methyl methacrylate (MMA), 8 parts by weight of butyl methacrylate (BMA), 36 parts by weight of butyl acrylate (BA), 24 parts by weight of acrylic acid (AA), 4 parts by weight of 3-methacryloxypropyltrimethoxysilane (MPTS) and 6 parts by weight of tert-butylperoxy-2-ethylhexanoate (TBPEH) into the aforementioned reaction vessel over the course of 4 hours and further reacting at the same temperature for 2 hours to obtain an acrylic polymer organic solvent solution (A1") containing carboxyl groups and hydrolyzable silyl groups and having a number average molecular weight of 10200. The combined content of hydroxyl groups, amino groups, carboxyl groups and alkoxysilyl groups (specific functional groups) in A1" was 3.13 mol/kg (refer to the following Table 1-1).

224 parts of the aforementioned surface-coated colloidal silica liquid dispersion (A') were then added at the same temperature and stirred for 1 hour followed by the addition of 50 parts of glycidyl acrylate and 0.07 parts of methoquinone and stirring for 1 hour to obtain cured underlayer raw material (A1) in which the hydrolyzable silyl groups in the polymer organic solvent solution (A1") were bound to the surface-coated colloidal silica.

<Preparation of Cured Underlayer Raw Material (A2)>

198 parts by weight of methoxypropanol were added to a reaction vessel followed by raising the temperature to 80° C., dropping in a mixture containing 60 parts by weight of ethyl methacrylate (EMA), 16 parts by weight of hydroxyethyl methacrylate (HEMA), 30 parts by weight of butyl acrylate (BA), 30 parts by weight of acrylic acid (AA), 4 parts by weight of 3-methacryloxypropyltrimethoxysilane (MPTS), 54 parts by weight of PnP and 6 parts by weight of tert-butylperoxy-2-ethylhexanoate (TBPEH) into the aforementioned reaction vessel over the course of 4 hours and further reacting at the same temperature for 2 hours to obtain an acrylic polymer organic solvent solution (A2") containing carboxyl groups and hydrolyzable silyl groups and having a number average molecular weight of 10200. The combined content of hydroxyl groups, amino groups, carboxyl groups and alkoxysilyl groups (specific functional groups) in A2" was 3.53 mol/kg (refer to the following Table 1-1).

224 parts of the aforementioned surface-coated colloidal silica liquid dispersion (N) were then added at the same temperature and stirred for 1 hour followed by the addition of 50 parts of glycidyl acrylate and 0.07 parts of methoquinone and stirring for 1 hour to obtain cured underlayer raw material (A2) in which the hydrolyzable silyl groups in the polymer organic solvent solution (A2") were bound to the surface-coated colloidal silica.

TABLE 1-1

| (meth)acrylic resin | Monomer | | | | | Substance equivalent of SFG* per weight |
|---|---|---|---|---|---|---|
| | Type | Molecular weight | Number of SFG* per one molecule | Amount | Substance equivalent of SFG* | |
| A1 | MMA | 100.1 | 0 | 40 | 0.00 | 3.13 |
| | BMA | 142.2 | 0 | 8 | 0.00 | |
| | BA | 128.2 | 0 | 36 | 0.00 | |
| | AA | 72.1 | 1 | 24 | 0.33 | |
| | MPTS | 228.3 | 1 | 4 | 0.02 | |
| A2 | EMA | 114.1 | 0 | 60 | 0.00 | 3.53 |
| | HEMA | 130.1 | 1 | 16 | 0.12 | |
| | BA | 128.2 | 0 | 30 | 0.00 | |
| | AA | 72.1 | 1 | 24 | 0.33 | |
| | MPTS | 228.3 | 1 | 4 | 0.02 | |

SFG* (specific functional groups): amino group, carboxylic group, and alkoxysilyl group <Preparation of Cured Underlayer Coating Agent (I)>

40 parts by weight of pentaerythritol tetraacrylate (Aronix M-450, Toagosei Co., Ltd.), 20 parts by weight of ethylene oxide-modified trimethylolpropane triacrylate (Aronix M-350, Toagosei Co., Ltd.), 50 parts by weight of the aforementioned cured underlayer raw material (A1), 50 parts by weight of organic solvent-dispersible surface-modified colloidal silica (MEK-AC-2140Z, solid content: 40%. Nissan Chemical Industries, Ltd.), 10 parts by weight of hydroxyphenyltriazine-based ultraviolet absorber (Tinuvin 400, BASF Corp.), 10 parts by weight of phenyl 1-hydroxyethyl ketone (Irgacure 184, BASF Corp.), 20 parts by weight of methyl ethyl ketone, 100 parts by weight of methoxypropanol and 40 parts by weight of isopropanol were added to prepare cured underlayer coating agent (I). The raw material composition of the cured underlayer coating agent (I) is summarized in the following Table 1-2.

<Preparation of Cured Underlayer Coating Agents (II) to (IV), (VII) to (VIII)>

Cured underlayer coating agents (II) to (VIII) were prepared to have the compositions shown in the following Table 1-2 using the same method as that of cured underlayer coating agent (I).

<Preparation of Coating Composition (IX) for Cured Underlayer>

56 g of tungsten acetate slurry (PCTR-2020 manufactured by Sumitomo Osaka Cement Co., Ltd., solid content concentration: 20% by weight) were diluted with 848 g of 2-propanol. The slurry was subjected to dispersion treatment using a bead mill. The particle diameter at 50% in the cumulative distribution and the particle diameter at 90% in the cumulative distribution as determined by measuring particle size distribution of the slurry subjected to dispersion treatment by laser diffraction were 44 nm and 75 nm, respectively.

Next, 0.1 part by weight of concentrated hydrochloric acid (12 M) were added to 100 parts by weight of a water-dispersible colloidal silicon liquid dispersion (Cataloid SN-30, particle diameter: approx. 17 nm, solid content concentration: 30% by weight, manufactured by Catalysts and Chemicals Industry Co., Ltd.) and stirred well. This liquid dispersion was then cooled to 10° C. followed by dropping in 161 parts by weight of methyltrimethoxysilane. The temperature of the reaction solution began to rise due to heat of the reaction immediately after adding the methyltrimethoxysilane, and rose to 60° C. within several minutes after the start of addition of the methyltrimethoxysilane. After reaching 60° C., the temperature of the reaction solution was gradually lowered while cooling in an ice bath. At the stage the temperature of the reaction solution reached 35° C., the reaction solution was stirred for 5 hours to maintain at this temperature, and after having mixed therein 0.8 parts by weight of a 45% by weight methanol solution of a curing catalyst in the form of choline and 5 parts by weight of a pH adjuster in the form of acetic acid, the mixture was stirred to uniformity to obtain a hydrolysis-condensation product of an organic silicon compound.

267 parts by weight of a solution of a partial condensate of an organic silicon compound were slowly mixed with 181 parts by weight of the titanium oxide slurry subjected to the aforementioned dispersion treatment by dropping followed by stirring well to obtain a coating composition (IX) for the cured underlayer containing a hydrolysis-condensation product of an organic silicon compound as a main component thereof (Method for Preparing Adhesive Layer Coating Agent>

79.9 parts by weight of ethyl methacrylate (EMA), 33.6 parts by weight of cyclohexyl methacrylate (CHMA), 13.0 parts by weight of 2-hydroxyethyl methacrylate (HEMA), 126.6 parts by weight of methyl isobutyl ketone (MIRK) and 63.3 parts by weight of 2-butanol (2-BuOH) were added to and mixed in a flask equipped with a reflux condenser and stirrer in which the air had been replaced with nitrogen. After passing nitrogen gas through the mixture to remove the oxygen, the temperature was raised to 70° C. in the presence of a nitrogen gas flow followed by the addition of 0.33 parts by weight of azobisisobutyronitrile (AIBN) and reacting in the presence of a nitrogen gas flow for 5 hours while stirring at 70° C. An additional 0.8 parts by weight of AIBN were added followed by raising the temperature to 80° C. and reacting for 3 hours to obtain an acrylic copolymer solution having a non-volatile content concentration of 39.6% by weight. The weight average molecular weight of the acrylic copolymer as measured by GPC (column: Shodex GPCA-804, eluent: chloroform) as polystyrene was 125,000.

Continuing, 43.2 parts by weight of MIRK, 21.6 parts by weight of 2-BuOH and 83.5 parts by weight of 1-methoxy-2-propanol were added to 100 parts by weight of the aforementioned acrylic copolymer solution and mixed followed by the addition of 5.3 parts by weight of Tinuvin 400 (triazine-based ultraviolet absorber, Ciba Specialty Chemicals Plc Ltd.) and 10.6 parts by weight of Vestanat B1358/100 (polyisocyanate compound precursor, Degussa Japan Co., Ltd.) at 1.0 equivalent of isocyanate groups to 1 equivalent of hydroxyl groups of the acrylic copolymer present in the acrylic resin solution, and further adding 0.15 parts by weight of dimethyl dineodecanoate tin (DMDNT) and stirring for 1 hour at 25° C. to prepare an adhesive layer coating agent having an acrylic copolymer resin for the main component thereof

TABLE 1-2

| Coating Comp. | Multi-functional acrylate | | Organic-inorganic hybrid type side chain acrylic group (meth) acrylic resin | | Surface-modified Colloidal silica | Ultraviolet absorbing agent Tinuvin 400 |
|---|---|---|---|---|---|---|
| | M450 tetra-func. | M350 tri-func. | A1 Solid content con.: 40% Fine particles amount: 44% | A2 Solid content con.: 40% Fine particles amount: 33% | MEK-AC-2140Z Solid content con.: 40% | |
| (I) | 40 | 20 | 50 | — | 50 | 10 |
| (II) | 50 | 10 | — | 50 | 50 | 10 |
| (III) | 40 | 20 | 50 | — | 50 | — |
| (IV) | — | 12 | 20 | — | 200 | — |
| (VII) | 60 | 40 | — | — | — | — |
| (VIII) | — | 4 | 20 | — | 220 | — |
| (IX) | | | see text of Description | | | |
| (X) | | | see text of Description | | | |
| (XI) | | | see text of Description | | | |
| (XII) | | | see text of Description | | | |

[Production of Polymer Substrate with a Hard Coat Layer]

Example 1

A polycarbonate resin (Teijin Ltd., Panlite 1250Z) was introduced into an injection press-molding machine, whereby a 600 mm square transparent polycarbonate resin sheet having a thickness of 4 mm was obtained.

Using the polycarbonate resin sheet as a substrate, a cured underlayer coating agent (I) was applied to the surfaces thereof by dip-coating, and after air drying, both sides thereof were irradiated with 1000 mJ/cm$^2$ ultraviolet light using a high-pressure mercury lamp, whereby a cured underlayer having a film thickness of about 8 μm was formed on both sides of the polycarbonate substrate.

The polycarbonate substrate having a size of 60×60 cm and having the cured underlayer formed on both surfaces thereof was placed in close contact with the electrode surface on the high frequency power application side of a parallel plate electrode of the capacitive coupling PE-CVD device shown in FIG. 1 (reference sign 30 in the drawing), and the device was evacuated for 1 hour. The final vacuum pressure was 0.03 Pa.

Next, argon gas (purity 99.9% or more) was introduced into the system at 1200 sccm through piping to which a mass flow controller was attached, a high frequency power of 1.0 KW at 13.56 MHz was applied between the parallel plate electrodes having a cooling pipe to generate plasma in the space between the parallel plate electrodes. In this state, high frequency power was applied for a total of 200 seconds to apply a plasma treatment on one side of the cured underlayer.

After the plasma treatment, the flow of argon gas was stopped, and subsequently, a silicon oxide layer formation process was performed by PE-CTD.

Specifically, 10 sccm of 1,3,5,7-tetramethylcyclotetrasiloxane (purity 99.99% or more; hereinafter referred to as D4H), and 300 sccm of oxygen (purity 99.9% or more) were introduced into the system through the piping to which the mass flow controller was attached, and a high frequency power of 1.5 KW at 13.56 MHz was applied between the parallel plate electrodes via a matching box to generate plasma in the space between the parallel plate electrodes.

After a high frequency power of 1.5 KW was applied for 60 seconds with a D4H flow rate of 10 sccm and an oxygen flow rate of 300 sccm, the D4H flow rate was continuously increased to 95 sccm and the oxygen flow was continuously increased to 1350 sccm over 40 seconds ("continuously" means at a constant rate over an interval), and the high frequency power was continuously reduced to 1.0 KW.

The average deposition rate from the start of formation of the silicon oxide layer by PE-CVD until 30 seconds had elapsed was 0.8 nm/sec.

A high frequency power of 1.5 KW was applied for 480 seconds with a D4H flow rate of 95 sccm and an oxygen flow rate of 1350 sccm. While the high frequency power was maintained at 1.0 KW, the D4H flow rate and the oxygen flow rate were continuously reduced over 60 seconds to 50 sccm and 1000 sccm, respectively.

A high frequency power of 1.0 KW was applied for 200 seconds with a D4H flow rate of 50 sccm and an oxygen flow rate of 1000 sccm. While the high frequency power was maintained at 1.0 KW, the D4H flow rate was continuously reduced over 30 seconds to 0 sccm, and thereafter the application of the high frequency power was stopped. Note that the oxygen flow rate was maintained at 1000 sccm until the application of the high frequency power was stopped.

The substrate on which the formation of the silicon oxide layer by PE-CVD was completed was cooled on the parallel plate electrode for 5 minutes, the inside of the device was returned to atmospheric pressure, and the obtained substrate was removed from the device, whereby the target polymer substrate with a hard coat layer was obtained.

Note that, the film thickness of the entirety of the silicon oxide layer obtained by PE-CVD was calculated at 5.8 µm when the second decimal place was rounded off, the film thickness of the initial dense layer was 0.05 µm, the film thickness of the layer in which the film properties gradually change from the initial dense layer to the bulk layer (gradient layer) was 0.2 µm, the film thickness of the bulk layer was 4.2 µm, the film thickness of the layer in which the film properties gradually change from the bulk layer to the high hardness layer (gradient layer) was 0.4 µm, and the film thickness of the high hardness layer was 0.9 µm. Furthermore, the maximum temperature of the substrate surface throughout the plasma treatment process and the deposition process of the silicon oxide layer by PE-CVD on the side on which the silicon oxide layer was formed by PE-CVD was about 110° C.

The performance evaluation results of the polymer substrate with a hard coat layer and the physical properties of the layers thereof are shown in Table 2. Regarding the Examples and Comparative Examples below, in the same manner as Example 1, the performance evaluation results of the polymer substrates with a hard coat layer obtained in these Examples and the physical properties of the layers thereof are shown in Tables 3 to 11. Note that in the Tables, the physical property values of the cured underlayer are the values of the stage immediately preceding the formation of the silicon oxide layer by PE-CVD after the layer has been subjected to the plasma treatment.

Example 2

A polymer substrate with a hard coat layer was formed in the same manner as Example 1 except that a cured underlayer coating agent (II) was used in place of the cured underlayer coating agent (I) of Example 1, and the silicon oxide layer formation conditions were changed to the conditions shown in Table 2 below.

The film thickness of the entirety of the silicon oxide layer obtained by PE-CVD was calculated at 5.8 µm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 3 below.

Example 3

A polymer substrate with a hard coat layer was formed in the same manner as Example 1 except that a cured underlayer coating agent (III) was used in place of the cured underlayer coating agent (I) of Example 1, and the silicon oxide formation conditions were changed to the conditions shown in Table 2 below.

The film thickness of the entirety of the silicon oxide layer obtained by PE-CVD was calculated at 5.8 µm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 3 below.

Example 4

A polymer substrate with a hard coat layer was formed in the same manner as Example 1 except that a cured underlayer coating agent (IV) was used in place of the cured underlayer coating agent (I) of Example 1, and the silicon oxide formation conditions were changed to the conditions shown in Table 2 below.

The film thickness of the entirety of the silicon oxide layer obtained by PE-CVD was calculated at 5.5 µm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 3 below.

Example 5

A polymer substrate with a hard coat layer was formed in the same manner as Example 4 except that the treatment duration of the plasma treatment of Example 4 was changed to 400 seconds, and the silicon oxide layer formation conditions were changed to the conditions shown in Table 2-1 below.

The film thickness of the entirety of the silicon oxide layer obtained by PE-CVD was calculated at 5.5 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 115° C. The thicknesses of the layers are shown in Table 3 below.

Example 6

A polymer substrate with a hard coat layer was formed in the same manner as Example 1 except that the silicon oxide formation conditions of Example 1 were changed to the conditions shown in Table 2 below.

The film thickness of the silicon oxide layer obtained by PE-CVD was about 8.3 Furthermore, the maximum temperature of the substrate surface throughout the plasma treatment process and the deposition process of the silicon oxide layer by PE-CVD on the side on which the silicon oxide layer was formed by PE-CVD was about 115° C. The thicknesses of the layers are shown in Table 3 below.

Example 7

A polymer substrate with a hard coat layer was formed in the same manner as Example 1 except that the silicon oxide formation conditions of Example 1 were changed to the conditions shown in Table 2 below.

The film thickness of the silicon oxide layer obtained by PE-CVD was about 5.7 μm. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 3 below.

Example 8

A polymer substrate with a hard coat layer was formed in the same manner as Example 1 except that the silicon oxide formation conditions of Example 1 were changed to the conditions shown in Table 2 below.

The film thickness of the silicon oxide layer obtained by PE-CVD was about 0.4 μm. Furthermore, the maximum temperature of the substrate surface throughout the plasma treatment process and the deposition process of the silicon oxide layer by PE-CVD on the side on which the silicon oxide layer was formed by PE-CVD was about 100° C. The thicknesses of the layers are shown in Table 3 below.

Example 8

A polymer substrate with a hard coat layer was formed in the same manner as Example 1 except that the silicon oxide formation conditions of Example 1 were changed to the conditions shown in Table 2 below.

The film thickness of the entirety of the silicon oxide layer obtained by PE-CVD was about 8.0 μm. Furthermore, the maximum temperature of the substrate surface throughout the plasma treatment process and the deposition process of the silicon oxide layer by PE-CVD on the side on which the silicon oxide layer was formed by PE-CVD was about 115° C. The thicknesses of the layers are shown in Table 3 below.

Example 9

A polymer substrate with a hard coat layer was formed in the same manner as Example 1 except that a cured underlayer coating agent (IX) was used in place of the cured underlayer coating agent (I) of Example 1.

The film thickness of the silicon oxide layer obtained by PE-CVD was calculated at 7.9 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 115° C. The thicknesses of the layers are shown in Table 3 below.

Regarding Examples 1 to 10, the details of the chemical composition $Si_xC_yH_z$ of the silicon oxide layer (CVD layer) are shown in Table 4 below, the details of the nanoindentation measurement, surface roughness, and infrared absorption peak intensity ratio are shown in Table 5 below, and the details of the results of the performance evaluation of the polymer substrate with a hard coat layer are shown in Table 6 below.

TABLE 2

| | | | | Undercoat Layer | | | |
| | | | | | PB Treatment | Surface | |
| Ex. | Substrate Resin | Coating Agent Type | Thick. (μm) | Output (W) | Treat. Time (sec) | Roughness (Ra) (nm) | Water Contact Angle (°) |
| --- | --- | --- | --- | --- | --- | --- | --- |
| Ex. 1 | PC | (I) | 8 | 1000 | 200 | 1.4 | 30 |
| Ex. 2 | 4 mm | (II) | 8 | 1000 | 200 | 1.5 | 30 |
| Ex. 3 | Thickness | (III) | 8 | 1000 | 200 | 1.3 | 25 |
| Ex. 4 | | (IV) | 8 | 1000 | 200 | 1.1 | 35 |
| Ex. 5 | | (IV) | 8 | 1000 | 400 | 3.8 | 20 |
| Ex. 6 | | (I) | 8 | 1000 | 200 | 1.4 | 30 |
| Ex. 7 | | (I) | 8 | 1000 | 200 | 1.4 | 30 |
| Ex. 8 | | (I) | 8 | 1000 | 200 | 1.4 | 30 |
| Ex. 9 | | (I) | 8 | 1000 | 200 | 1.4 | 30 |
| Ex. 10 | | (IX) | 8 | 1000 | 600 | 1.4 | 30 |

TABLE 2-continued

| | | CVD Deposition Process | | | | | |
|---|---|---|---|---|---|---|---|
| | | Initial | | | High Hardness Layer | | Treatment |
| Ex. | Control Factors | Dense Layer | Gradient Layer | Bulk Layer | Gradient | Constant Part | End |
| Ex. 1 | Power (W) | 1500 | 1500 → 1000 | 1000 | 1000 | 1000 | 1000 |
| | Monomer (sccm) | 10 | 10 → 95 | 95 | 95 → 50 | 50 | 50 → 0 |
| | Oxygen (sccm) | 300 | 300 → 1350 | 1350 | 1350 → 1000 | 1000 | 1000 |
| | Time (sec) | 60 | 40 | 480 | 60 | 200 | 30 |
| Ex. 2 | Power (W) | 1500 | 1500 → 1000 | 1000 | 1000 | 1000 | 1000 |
| | Monomer (sccm) | 10 | 10 → 95 | 95 | 95 → 50 | 50 | 50 → 0 |
| | Oxygen (sccm) | 300 | 300 → 1350 | 1350 | 1350 → 400 | 400 | 400 |
| | Time (sec) | 60 | 40 | 480 | 60 | 200 | 30 |
| Ex. 3 | Power (W) | 1500 | 1500 → 1000 | 1000 | 1000 → 2000 | 2000 | 2000 |
| | Monomer (sccm) | 10 | 10 → 95 | 95 | 95 | 95 | 95 → 0 |
| | Oxygen (sccm) | 300 | 300 → 1350 | 1350 | 1350 | 1350 | 1350 |
| | Time (sec) | 60 | 40 | 480 | 60 | 90 | 30 |
| Ex. 4 | Power (W) | 1500 | 1500 → 1000 | 1000 | 1000 → 1500 | 1500 | 1500 |
| | Monomer (sccm) | 10 | 10 → 95 | 95 | 95 → 70 | 70 | 70 → 0 |
| | Oxygen (sccm) | 300 | 300 → 1350 | 1350 | 1350 | 1350 | 1350 |
| | Time (sec) | 60 | 40 | 420 | 60 | 150 | 30 |
| Ex. 5 | Power (W) | 1500 | 1500 → 1000 | 1000 | 1000 → 1500 | 1500 | 1000 |
| | Monomer (sccm) | 10 | 10 → 95 | 95 | 95 → 70 | 70 | 70 → 0 |
| | Oxygen (sccm) | 300 | 300 → 1350 | 1350 | 1350 → 1000 | 1000 | 1000 |
| | Time (sec) | 60 | 40 | 420 | 60 | 150 | 30 |
| Ex. 6 | Power (W) | 1500 | 1500 → 1000 | 1000 | 1000 → 1500 | 1500 | 1500 |
| | Monomer (sccm) | 10 | 10 → 95 | 95 | 95 → 70 | 70 | 70 → 0 |
| | Oxygen (sccm) | 300 | 300 → 1700 | 1700 | 1700 → 1000 | 1000 | 1000 |
| | Time (sec) | 60 | 40 | 700 | 60 | 150 | 30 |
| Ex. 7 | Power (W) | 1500 | 1500 → 1000 | 1000 | 1000 → 1500 | 1500 | 1500 |
| | Monomer (sccm) | 10 | 10 → 70 | 70 | 70 → 50 | 50 | 50 → 0 |
| | Oxygen (sccm) | 300 | 300 → 1500 | 1500 | 1500 → 500 | 500 | 500 |
| | Time (sec) | 60 | 40 | 720 | 60 | 60 | 30 |
| Ex. 8 | Power (W) | 1500 | — | — | — | 1500 | 1500 |
| | Monomer (sccm) | 30 | — | — | — | 30 | 30 → 0 |
| | Oxygen (sccm) | 300 | — | — | — | 300 | 300 |
| | Time (sec) | 75 | — | — | — | 75 | 30 |
| Ex. 9 | Power (W) | 1100 | 1100 → 1000 | 1000 | 1000 | 1000 | 1000 |
| | Monomer (sccm) | 70 | 70 → 95 | 95 | 95 → 50 | 50 | 50 → 0 |
| | Oxygen (sccm) | 1250 | 1250 → 1700 | 1700 | 1700 → 1000 | 1000 | 1000 |
| | Time (sec) | 30 | 40 | 720 | 60 | 200 | 30 |
| Ex. 10 | Power (W) | 1500 | 1500 → 1000 | 1000 | 1000 | 1000 | 1000 |
| | Monomer (sccm) | 10 | 10 → 95 | 95 | 95 → 50 | 50 | 50 → 0 |
| | Oxygen (sccm) | 300 | 300 → 1350 | 1350 | 1350 → 1000 | 1000 | 1000 |
| | Time (sec) | 60 | 40 | 720 | 60 | 200 | 30 |

TABLE 3

| | CVD Layer | | | | | |
|---|---|---|---|---|---|---|
| | Thickness (μm) | | | | | |
| Example | Initial Dense Layer | Gradient Layer | Bulk Layer | Gradient Layer | High Hardness Layer | All Layers | Initial Average Deposition Rate (nm/sec) |
| Ex. 1 | 0.05 | 0.2 | 4.2 | 0.4 | 0.9 | 5.8 | 0.8 |
| Ex. 2 | 0.05 | 0.2 | 4.2 | 0.4 | 0.9 | 5.8 | 0.8 |
| Ex. 3 | 0.05 | 0.2 | 4.2 | 0.5 | 0.8 | 5.8 | 0.8 |
| Ex. 4 | 0.05 | 0.2 | 3.7 | 0.5 | 1.0 | 5.5 | 0.8 |
| Ex. 5 | 0.05 | 0.2 | 3.7 | 0.5 | 1.0 | 5.5 | 0.8 |
| Ex. 6 | 0.05 | 0.2 | 6.5 | 0.5 | 1.0 | 8.3 | 0.8 |
| Ex. 7 | 0.05 | 0.2 | 4.8 | 0.3 | 0.3 | 5.7 | 0.8 |
| Ex. 8 | 0.20 | — | — | — | 0.2 | 0.4 | 2.6 |
| Ex. 9 | 0.20 | 0.3 | 6.3 | 0.4 | 0.8 | 8.0 | 6 |
| Ex. 10 | 0.05 | 0.2 | 6.3 | 0.4 | 0.9 | 7.9 | 0.8 |

TABLE 4

| | Composition of CVD Layer SiO$_x$C$_y$H$_z$ | | | | | | | | |
|---|---|---|---|---|---|---|---|---|---|
| | Position 0.04 μm from Interface | | | Position 2 μm from Interface | | | Surface | | |
| Example | x | y | z | x | y | z | x | y | z |
| Ex. 1 | 1.96 | 0.05 | 0.16 | 1.90 | 0.21 | 0.60 | 1.97 | 0.08 | 0.23 |
| Ex. 2 | 1.96 | 0.05 | 0.16 | 1.90 | 0.21 | 0.60 | 1.96 | 0.08 | 0.23 |
| Ex. 3 | 1.96 | 0.05 | 0.16 | 1.90 | 0.21 | 0.60 | 1.94 | 0.11 | 0.30 |
| Ex. 4 | 1.96 | 0.05 | 0.16 | 1.90 | 0.21 | 0.60 | 1.94 | 0.13 | 0.38 |
| Ex. 5 | 1.96 | 0.05 | 0.16 | 1.90 | 0.21 | 0.60 | 1.95 | 0.10 | 0.29 |
| Ex. 6 | 1.96 | 0.05 | 0.16 | 1.90 | 0.28 | 0.75 | 1.95 | 0.10 | 0.29 |
| Ex. 7 | 1.96 | 0.05 | 0.16 | 1.92 | 0.18 | 0.45 | 1.97 | 0.08 | 0.23 |
| Ex. 8 | 1.95 | 0.09 | 0.28 | — | — | — | 1.95 | 0.09 | 0.28 |
| Ex. 9 | 1.93 | 0.15 | 0.47 | 1.90 | 0.28 | 0.75 | 1.97 | 0.08 | 0.23 |
| Ex. 10 | 1.96 | 0.05 | 0.16 | 1.90 | 0.21 | 0.60 | 1.97 | 0.08 | 0.23 |

TABLE 5

| | Nanoindentation Measurement | | | Infrared Absorbance Peak Intensity Ratio | | | | | |
|---|---|---|---|---|---|---|---|---|---|
| | Maximum | Indentation | Surface | Position 0.04 μm from Interface | | Position 2 μm from Interface | | Surface | |
| Example | Indentation Depth (nm) | Hardness (Gpa) | Roughness (Ra) (nm) | α930/α1020 | α1280/α1020 | α930/α1020 | α1280/α1020 | α930/α1020 | α1280/α1020 |
| Ex. 1 | 120 | 5.9 | 1.7 | 0.14 | 0.000 | 0.27 | 0.013 | 0.24 | 0.002 |
| Ex. 2 | 115 | 6.6 | 1.6 | 0.14 | 0.000 | 0.27 | 0.013 | 0.21 | 0.002 |
| Ex. 3 | 128 | 5.4 | 1.9 | 0.14 | 0.000 | 0.27 | 0.013 | 0.24 | 0.004 |
| Ex. 4 | 135 | 5.0 | 2.2 | 0.14 | 0.000 | 0.27 | 0.013 | 0.24 | 0.008 |
| Ex. 5 | 130 | 5.4 | 2.0 | 0.14 | 0.000 | 0.27 | 0.013 | 0.23 | 0.004 |
| Ex. 6 | 130 | 5.3 | 2.0 | 0.14 | 0.000 | 0.29 | 0.017 | 0.23 | 0.004 |
| Ex. 7 | 117 | 6.4 | 1.6 | 0.14 | 0.000 | 0.28 | 0.014 | 0.21 | 0.002 |
| Ex. 8 | 112 | 7.1 | 1.1 | 0.19 | 0.002 | — | — | 0.19 | 0.002 |
| Ex. 9 | 120 | 5.9 | 1.7 | 0.26 | 0.013 | 0.28 | 0.016 | 0.24 | 0.002 |
| Ex. 10 | 120 | 5.9 | 1.7 | 0.14 | 0.000 | 0.27 | 0.013 | 0.24 | 0.002 |

TABLE 6

| | Performance Evaluation of Polymer Substrate with Hard Coat Layer | | | | | | | | | | |
|---|---|---|---|---|---|---|---|---|---|---|---|
| | Initial Performance | | | | | Durability | | | | | |
| | | | | | Taber Abrasion | | | | | | |
| | | | Optical | | Resistance | Boiling Water | | | Weathering Resistance | | |
| | | | Properties | | 1000 | Resistance | | | 110° C. 1000 hr | | |
| Example | Appearance (App.) | Close Contact | TT (%) | Haze (%) | Revolutions ΔH(%) | App. | Close Contact | Aging Results | App. | Close Contact | Aging Results |
| Ex. 1 | A | A(100) | 89.1 | 0.5 | A(0.4) | A | A(100) | A | A | A(100) | A |
| Ex. 2 | A | A(100) | 89.1 | 0.5 | A(0.3) | A | A(100) | A | A | A(100) | A |
| Ex. 3 | A | A(100) | 89.2 | 0.4 | A(0.5) | A | A(100) | A | A | A(100) | A |
| Ex. 4 | A | A(100) | 88.8 | 0.6 | A(0.7) | A | A(100) | A | A | A(100) | A |
| Ex. 5 | A | A(100) | 88.8 | 0.7 | A(0.5) | A | A(100) | A | A | A(100) | A |
| Ex. 6 | A | A(100) | 89.0 | 0.6 | A(0.5) | A | A(100) | A | A | A(100) | A |
| Ex. 7 | A | A(100) | 89.0 | 0.5 | A(0.4) | A | A(100) | A | A | A(100) | A |
| Ex. 8 | A | A(100) | 89.1 | 0.5 | A(0.3) | A | A(100) | A | A | A(100) | A |
| Ex. 9 | A | A(100) | 89.0 | 0.5 | A(0.4) | A | A(100) | D | A | A(100) | A |
| Ex. 10 | A | A(100) | 89.1 | 0.5 | A(0.4) | A | A(100) | D | A | A(100) | A |

TABLE 6-continued

Performance Evaluation of Polymer Substrate with Hard Coat Layer Durability

| | Weathering Resistance 130° C. 1000 hr | | | Weathering Resistance SXOM 180 W/m² 18 Minutes Rainfall for 120 min | | | | | | | | |
|---|---|---|---|---|---|---|---|---|---|---|---|---|
| | | | | 2000 hr | | | 4000 hr | | | 8000 hr | | |
| Example | App. | Close Contact | Aging Results | App. | Close Contact | ΔE | App. | Close Contact | ΔE | App. | Close Contact | ΔE |
| Ex. 1 | A | A(100) | A | A | A(100) | 0.1 | A | A(100) | 0.4 | A | D(80) | 0.9 |
| Ex. 2 | A | A(100) | A | A | A(100) | 0.1 | A | A(100) | 0.4 | D | D(20) | 2.4 |
| Ex. 3 | A | A(100) | A | A | A(100) | 0.5 | A | A(100) | 1.4 | A | D(20) | 3.6 |
| Ex. 4 | A | A(100) | A | A | A(100) | 0.4 | A | A(100) | 1.2 | A | D(0) | 2.8 |
| Ex. 5 | A | A(100) | A | A | A(100) | 0.4 | D | D(0) | 1.2 | — | — | — |
| Ex. 6 | A | A(100) | A | A | A(100) | 0.1 | A | A(100) | 0.4 | A | D(80) | 1.1 |
| Ex. 7 | A | A(100) | A | A | A(100) | 0.1 | A | A(100) | 0.4 | A | D(80) | 0.8 |
| Ex. 8 | A | A(100) | A | A | A(100) | 0.1 | A | D(0) | 2.5 | — | — | — |
| Ex. 9 | A | A(100) | A | A | A(100) | 0.1 | A | D(20) | 0.4 | C | D(0) | 0.9 |
| Ex. 10 | C | A(100) | A | A | A(100) | 0.1 | A | A(100) | 0.2 | A | A(100) | 0.5 |

Comparative Example 1

Formation of polymer substrate with a hard coat layer was attempted in the same manner as Example 1 except that a cured underlayer coating agent (VII) was used in place of the cured underlayer coating agent (I) of Example 1.

However, in the polymer substrate with a hard coat layer, the cured underlayer decomposed/deteriorated during the plasma treatment, and the surface roughness thereof exceeded 20 nm, and thereafter, clouding of the appearance thereof occurred during formation of the silicon oxide layer, and the silicon oxide layer naturally peeled off. Thus, the results were judged as poor, and the performance evaluation of the polymer substrate with a hard coat layer was not performed.

Comparative Example 2

A polymer substrate with a hard coat layer was formed in the same manner as Example 1 except that a cured underlayer coating agent (VIII) was used in place of the cured underlayer coating agent (I) of Example 1.

The film thickness of the entirety of the silicon oxide layer obtained by PE-CVD was calculated at 5.8 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 8 below, Comparative Example 3

A polymer substrate with a hard coating layer was produced in the same manner as Example 1 except that the silicon oxide layer formation conditions of Example 1 were changed to the conditions shown in Table 7 below.

The film thickness of the entirety of the silicon oxide layer obtained by PE-CVD was calculated at 6.0 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 8 below, Comparative Example 4

A polymer substrate with a hard coating layer was produced in the same manner as Example 4 except that the silicon oxide layer formation conditions of Example 1 were changed to the conditions shown in Table 7 below.

The film thickness of the entirety of the silicon oxide layer obtained by PE-CVD was calculated at 6.1 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 8 below.

Comparative Example 5

A polymer substrate with a hard coating layer was produced in the same manner as Example 1 except that the silicon oxide layer formation conditions of Example 1 were changed to the conditions shown in Table 7 below.

The film thickness of the entirety of the silicon oxide layer obtained by PE-CVD was calculated at 4.3 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 105° C. The thicknesses of the layers are shown in Table 8 below, Comparative Example 6

A polymer substrate with a hard coating layer was produced in the same manner as Example 1 except that the silicon oxide layer formation conditions of Example 1 were changed to the conditions shown in Table 7 below.

The film thickness of the entirety of the silicon oxide layer obtained by PE-CVD was calculated at 5.9 μm when rounding off the second decimal place. Furthermore, the maximum temperature of the substrate surface throughout the plasma treatment process and the deposition process of the silicon oxide layer by PE-CVD on the side on which the silicon oxide layer was formed by PE-CVD was about 110° C. The thicknesses of the layers are shown in Table 8 below.

Comparative Example 7

A polymer substrate with a hard coat layer was obtained in the manner of Example 1 of Patent Literature 5.

In other words, a polycarbonate resin sheet was air-spray coated with an active energy ray-curable primer composition to a dry film thickness of 8 μm. Subsequently, the polycarbonate resin sheet was preheated at 80° C. for 10 minutes, and thereafter irradiated with active energy rays at an irradiation amount of 2,000 mJ/cm$^2$ using a high-pressure mercury lamp, whereby a cured coating layer was obtained.

Next, an inorganic material layer was formed thereon using a plasma CVD device so that the film thickness was 5 μm, whereby a polymer substrate with a hard coat layer was obtained.

Comparative Example 8

A polymer substrate with a hard coat layer was obtained in the manner of Example 1 of Patent Literature 6.

In other words, a UV-curable resin (product name "UVHC7800", manufactured by Momentive Performance Materials Japan LLC) as a first hard coat layer was initially laminated, by a gravure printing method, onto the surface of a PPMA film (product name "RT050" manufactured by Kuraray Co., Ltd.), which is the substrate film, having a film thickness of 188 μm, and was allowed to dry for one minute at 60° C. in air, and thereafter was cured by irradiation with UV.

An organic-inorganic hybrid resin (product name "NH-1000G" manufactured by Nippon Soda Co., Ltd.) as an anchor coat layer was laminated onto the surface thereof by a barcode method. At this time, a filler (product name "NH-91005" manufactured by Nippon Soda Co., Ltd.) was mixed with the raw material resin.

Subsequently, a plasma deposition layer made of HMDSO (hexamethyldisiloxane) (manufactured by Shin-Etsu Chemical Co., Ltd.), as the second hard coat layer, was laminated thereon, whereby a polymer substrate with a hard coat layer was obtained.

The film thickness of the anchor coat layer was 7.0 μm, the amount of filler added was 2.5%, and the thickness of the second hard coat layer was 150 nm.

Comparative Example 9

A polymer substrate with a hard coat layer was obtained in the manner of Example 1 of Patent Literature 7.

In other words, a surface-cleaned Lexan polycarbonate plate (150 mm×150 mm×4 mm thickness) was flow-coated with a composite coating composition to a thickness of about 9 to 14 μm as a cured coating, and heat cured at 120° C. for 60 minutes, whereby an intermediate layer was obtained.

A film composed of silicon, oxygen, carbon and hydrogen atoms was laminated onto the coating film by plasma polymerization as the outermost layer, whereby a laminate was obtained. Specifically, first, prior to plasma polymerization, the substrate on which the cured coating of the composite coating composition was formed was manually cleaned with isopropyl alcohol and deionized water using a lint-free cloth. Next plasma polymerization was performed in a vacuum chamber by a continuous double-sided thermal expansion plasma process. Two plasma coating locations were formed by expanding thermal plasma columns creating argon plasma jets at supersonic speeds. The plasma jets expanded at the plasma coating site and reacted with the organosilicon reagent and an oxidant injected directly into the chamber. The organosilicon reagent was octamethylcyclotetrasiloxane (manufactured by Gelest), and the oxidizing agent was industrial grade oxygen 99% (manufactured by Airgas). The substrate was continuously transferred through the chamber and heated to about 40 to 70° C. before entering the coating position.

Regarding Comparative Examples 1 to 9, the details of the chemical composition $Si_xC_yH_z$ of the silicon oxide layer (CVD layer) are shown in Table 9 below, the details of the nanoindentation measurement, surface roughness, and infrared absorption peak intensity ratio are shown in Table 10 below, and the details of the results of the performance evaluation of the polymer substrate with a hard coat layer are shown in Table 11 below.

TABLE 7

| Example | Substrate Resin | Coating Agent Type | Undercoat Layer Thickness (μm) | PB Treatment Output (W) | PB Treatment Treatment Time (sec) | Surface Roughness (Ra) (nm) | Water Contact Angle (°) |
|---|---|---|---|---|---|---|---|
| Comp. Ex. 1 | PC 4 mm Thickness | (VII) | 8 | 1000 | 200 | 78.5 | 20 |
| Comp. Ex. 2 | | (VIII) | 8 | 1000 | 200 | 1.1 | 30 |
| Comp. Ex. 3 | | (I) | 8 | 1000 | 200 | 1.4 | 30 |
| Comp. Ex. 4 | | (I) | 8 | 1000 | 200 | 1.4 | 30 |
| Comp. Ex. 5 | | (I) | 8 | 1000 | 200 | 1.4 | 30 |
| Comp. Ex. 6 | | (I) | 8 | 1000 | 200 | 1.4 | 30 |
| Comp. Ex. 7 | PC | (X) | — | — | — | 8.0 | 80 |
| Comp. Ex. 8 | PMMA | (XI) | — | — | — | 7.0 | 70 |
| Comp. Ex. 9 | LexanPC | (XII) | — | — | — | 12.0 | 70 |

TABLE 7-continued

| | | CVD Deposition Process | | | | | |
| | | | | | High Hardness Layer | | |
| Example | Control Factors | Initial Dense Layer | Gradient Layer | Bulk Layer | Gradient | Constant Part | Treatment End |
|---|---|---|---|---|---|---|---|
| Comp. Ex. 1 | Power (W) | 1500 | 1500 → 1000 | 1000 | 1000 | 1000 | 1000 |
| | Monomer (sccm) | 10 | 10 → 95 | 95 | 95 → 50 | 50 | 50 → 0 |
| | Oxygen (sccm) | 300 | 300 → 1350 | 1350 | 1350 → 1000 | 1000 | 1000 |
| | Time (sec) | 60 | 40 | 480 | 60 | 200 | 30 |
| Comp. Ex. 2 | Power (W) | 1500 | 1500 → 1000 | 1000 | 1000 | 1000 | 1000 |
| | Monomer (sccm) | 10 | 10 → 95 | 95 | 95 → 50 | 50 | 50 → 0 |
| | Oxygen (sccm) | 300 | 300 → 1350 | 1350 | 1350 → 1000 | 1000 | 1000 |
| | Time (sec) | 60 | 40 | 480 | 60 | 200 | 30 |
| Comp. Ex. 3 | Power (W) | 1500 | 1500 → 1100 | 1100 | 1100 | 1100 | 1100 |
| | Monomer (sccm) | 10 | 10 → 95 | 95 | 95 → 70 | 70 | 70 → 0 |
| | Oxygen (sccm) | 300 | 300 → 1700 | 1700 | 1700 → 1250 | 1250 | 1250 |
| | Time (sec) | 60 | 40 | 450 | 60 | 160 | 30 |
| Comp. Ex. 4 | Power (W) | 1500 | 1500 → 800 | 800 | 800 | 800 | 800 |
| | Monomer (sccm) | 10 | 10 → 95 | 95 | 95 → 70 | 70 | 70 → 0 |
| | Oxygen (sccm) | 300 | 300 → 1700 | 1700 | 1700 → 1250 | 1250 | 1250 |
| | Time (sec) | 60 | 40 | 500 | 60 | 160 | 30 |
| Comp. Ex. 5 | Power (W) | 1500 | 1500 → 1100 | 1100 | 1100 | 1100 | 1100 |
| | Monomer (sccm) | 10 | 10 → 95 | 95 | 95 → 70 | 70 | 70 → 0 |
| | Oxygen (sccm) | 300 | 300 → 1700 | 1700 | 1700 → 1250 | 1250 | 1250 |
| | Time (sec) | 60 | 40 | 290 | 60 | 160 | 30 |
| Comp. Ex. 6 | Power (W) | 1500 | 1500 → 1100 | 1100 | — | — | 1100 |
| | Monomer (sccm) | 10 | 10 → 95 | 95 | — | — | 95 → 0 |
| | Oxygen (sccm) | 300 | 300 → 1700 | 1700 | — | — | 1700 |
| | Time (sec) | 60 | 40 | 630 | — | — | 30 |
| Comp. Ex. 7 | Power (W) | — | — | 1000 | — | — | 1000 |
| | Monomer (sccm) | — | — | 70 | — | — | 70 → 0 |
| | Oxygen (sccm) | — | — | 3000 | — | — | 3000 |
| | Time (sec) | — | — | 800 | — | — | 30 |
| Comp. Ex. 8 | Power (W) | — | — | 1000 | — | — | 1000 |
| | Monomer (sccm) | — | — | 70 | — | — | 70 → 0 |
| | Oxygen (sccm) | — | — | 3000 | — | — | 3000 |
| | Time (sec) | — | — | 50 | — | — | 30 |
| Comp. Ex. 9 | Power (W) | — | — | — | — | — | — |
| | Monomer (sccm) | — | — | — | — | — | — |
| | Oxygen (sccm) | — | — | — | — | — | — |
| | Time (sec) | — | — | — | — | — | — |

TABLE 8

| | CVD Layer Thickness (μm) | | | | | | |
|---|---|---|---|---|---|---|---|
| Example | Initial Dense Layer | Gradient Layer | Bulk Layer | Gradient Layer | High Hardness Layer | All Layers | Initial Average Deposition Rate (nm/sec) |
| Comp. Ex. 1 | Substrate Clouding; Silicon Oxide Layer Natural Peeling; Not Evaluated | | | | | | |
| Comp. Ex. 2 | 0.05 | 0.2 | 4.2 | 0.4 | 0.9 | 5.8 | 0.8 |
| Comp. Ex. 3 | 0.05 | 0.2 | 4.2 | 0.5 | 1.0 | 6.0 | 0.8 |
| Comp. Ex. 4 | 0.05 | 0.2 | 4.3 | 0.5 | 1.0 | 6.1 | 0.8 |
| Comp. Ex. 5 | 0.05 | 0.2 | 2.5 | 0.5 | 1.0 | 4.3 | 0.8 |
| Comp. Ex. 6 | 0.05 | 0.2 | 5.6 | — | — | 5.9 | 0.8 |
| Comp. Ex. 7 | — | — | — | — | — | 5.0 | — |
| Comp. Ex. 8 | — | — | — | — | — | 0.3 | — |
| Comp. Ex. 9 | — | — | — | — | — | 3.1 | — |

TABLE 9

CVD Layer Composition SiO$_x$C$_y$H$_z$

| Example | Position 0.04 μm from Interface | | | Position 2 μm from Interface | | | Surface | | |
|---|---|---|---|---|---|---|---|---|---|
| | x | y | z | x | y | z | x | y | z |
| Comp. Ex. 1 | Substrate Clouding; Silicon Oxide Layer Natural Peeling; Not Evaluated | | | | | | | | |
| Comp. Ex. 2 | 1.96 | 0.05 | 0.16 | 1.90 | 0.21 | 0.60 | 1.97 | 0.08 | 0.23 |
| Comp. Ex. 3 | 1.96 | 0.05 | 0.16 | 1.90 | 0.27 | 0.72 | 1.93 | 0.15 | 0.47 |
| Comp. Ex. 4 | 1.96 | 0.05 | 0.16 | 1.88 | 0.30 | 0.77 | 1.92 | 0.19 | 0.55 |
| Comp. Ex. 5 | 1.96 | 0.05 | 0.16 | 1.90 | 0.27 | 0.72 | 1.93 | 0.15 | 0.47 |
| Comp. Ex. 6 | 1.96 | 0.05 | 0.16 | 1.90 | 0.27 | 0.72 | 1.90 | 0.27 | 0.72 |
| Comp. Ex. 7 | 1.77 | 0.57 | 1.70 | 1.77 | 0.57 | 1.70 | 1.77 | 0.57 | 1.70 |
| Comp. Ex. 8 | 1.77 | 0.57 | 1.70 | — | — | — | 1.77 | 0.57 | 1.70 |
| Comp. Ex. 9 | 1.66 | 0.55 | 1.41 | 1.66 | 0.55 | 1.41 | 1.90 | 0.28 | 0.75 |

TABLE 10

| Example | Nanoindentation Measurement | | | Infrared Absorbance Peak Intensity Ratio | | | | | |
|---|---|---|---|---|---|---|---|---|---|
| | | | | Position 0.04 μm from Interface | | Position 2 μm from Interface | | Surface | |
| | Maximum Indentation Depth (nm) | Indentation Hardness (Gpa) | Surface Roughness (Ra) (nm) | α930/α1020 | α1280/α1020 | α930/α1020 | α1280/α1020 | α930/α1020 | α1280/α1020 |
| Comp. Ex. 1 | Substrate Clouding; Silicon Oxide Layer Natural Peeling; Not Evaluated | | | | | | | | |
| Comp. Ex. 2 | 143 | 3.8 | 2.2 | 0.14 | 0.000 | 0.27 | 0.013 | 0.24 | 0.002 |
| Comp. Ex. 3 | 135 | 5.0 | 2.1 | 0.14 | 0.000 | 0.28 | 0.016 | 0.26 | 0.013 |
| Comp. Ex. 4 | 146 | 4.1 | 2.4 | 0.14 | 0.000 | 0.32 | 0.022 | 0.29 | 0.018 |
| Comp. Ex. 5 | 134 | 5.1 | 1.9 | 0.14 | 0.000 | 0.28 | 0.016 | 0.26 | 0.013 |
| Comp. Ex. 6 | 144 | 3.7 | 2.2 | 0.14 | 0.000 | 0.28 | 0.016 | 0.28 | 0.016 |
| Comp. Ex. 7 | 145 | 3.6 | 2.2 | 0.37 | 0.052 | 0.37 | 0.052 | 0.37 | 0.052 |
| Comp. Ex. 8 | 145 | 3.6 | 2.2 | 0.37 | 0.052 | — | — | 0.37 | 0.052 |
| Comp. Ex. 9 | 145 | 3.6 | 2.2 | 0.35 | 0.054 | 0.35 | 0.054 | 0.27 | 0.019 |

TABLE 11

Performance Evaluation of Polymer Substrate with Hard Coat Layer

| Example | Initial Performance | | | | | Durability | | | | | |
|---|---|---|---|---|---|---|---|---|---|---|---|
| | | Optical Properties | | | Taber Abrasion Resistance 1000 Revolutions | Boiling Water Resistance | | | Weathering Resistance 110° C. 1000 hr | | |
| | Appear. | Close Contact | TT (%) | Haze (%) | ΔH (%) | App. | CC | Aging Results | App. | CC | Aging Results |
| Comp. Ex. 1 | Substrate Clouding; Silicon Oxide Layer Natural Peeling; Not Evaluated | | | | | | | | | | |
| Comp. Ex. 2 | A | D(0) | 89.3 | 0.4 | A(0.4) | C | D(0) | — | — | — | — |
| Comp. Ex. 3 | A | A(100) | 88.8 | 0.6 | A(1.3) | A | A(100) | A | A | A(100) | A |
| Comp. Ex. 4 | A | A(100) | 89.1 | 0.5 | A(0.7) | A | A(100) | A | A | A(100) | A |
| Comp. Ex. 5 | A | A(100) | 89.0 | 0.5 | A(1.1) | A | A(100) | A | A | A(100) | A |
| Comp. Ex. 6 | A | A(100) | 88.9 | 0.7 | A(1.7) | A | D(0) | — | A | A(100) | D |
| Comp. Ex. 7 | A | A(100) | 89.1 | 0.5 | A(1.8) | A | A(100) | D | A | A(100) | A |
| Comp. Ex. 8 | A | A(100) | 89.1 | 0.5 | D(3.3) | A | A(100) | D | A | A(100) | A |
| Comp. Ex. 9 | A | A(100) | 89.1 | 0.5 | A(0.7) | A | A(100) | D | A | A(100) | A |

TABLE 11-continued

Performance Evaluation of Polymer Substrate with Hard Coat Layer
Durability

| | Weathering Resistance | | | Weathering Resistance SXOM 180 W/m² 18 Minutes Rainfall for 120 min | | | | | | | | |
|---|---|---|---|---|---|---|---|---|---|---|---|---|
| | 130° C. 1000 hr | | | | | | | | | | | |
| | | | Aging | 2000 hr | | | 4000 hr | | | 8000 hr | | |
| Example | App. | CC | Results | App. | CC | ΔE | App. | CC | ΔE | App. | CC | ΔE |
| Comp. Ex. 1 | Substrate Clouding; Silicon Oxide Layer Natural Peeling; Not Evaluated | | | | | | | | | | | |
| Comp. Ex. 2 | — | — | — | — | — | — | — | — | — | — | — | — |
| Comp. Ex. 3 | A | A(100) | A | A | A(100) | 0.1 | A | A(100) | 0.4 | A | A(100) | 0.9 |
| Comp. Ex. 4 | A | A(100) | A | A | A(100) | 0.1 | A | A(100) | 0.4 | A | A(100) | 0.9 |
| Comp. Ex. 5 | A | A(100) | A | A | A(100) | 0.1 | A | A(100) | 0.4 | A | A(100) | 1.2 |
| Comp. Ex. 6 | A | A(100) | D | A | A(100) | 0.1 | A | D(0) | 0.6 | — | — | — |
| Comp. Ex. 7 | C | A(100) | A | A | A(100) | 0.1 | A | D(20) | 3.1 | C | D(0) | 7.8 |
| Comp. Ex. 8 | C | A(100) | A | A | A(100) | 0.1 | A | A(100) | 0.2 | C | D(0) | 2.2 |
| Comp. Ex. 9 | C | A(100) | A | A | A(100) | 0.6 | A | A(100) | 2.8 | C | D(0) | 6.4 |

Regarding the details of the "appearance" of initial performance, boiling water resistance, heat resistance (100° C. for 1000 hours and 130° C. for 1000 hours), and weathering resistance (2000 hours, 4000 hours, and 8000 hours) in Tables 6 and 11 above, the case which peeling and cracking did not occur is assigned the evaluation score of "A", the case which peeling did not occur but cracking occurred is assigned the evaluation score of "B", the case in which partial peeling occurred is assigned the evaluation score of "C", and the case in which cracking occurred and partial peeling occurred is assigned the evaluation score of "D".

Furthermore, regarding details other than "appearance", acceptable cases are assigned the evaluation score of "A", and unacceptable cases are assigned the evaluation score of "D".

The following is a simplified summary of the above Tables;

TABLE 12

| | | Silicon Oxide Layer(CVD Layer) | | | | | | |
|---|---|---|---|---|---|---|---|---|
| | Cured | Thickness | a1 (0.04 μm) | | | a3 (Surface) | | |
| Example | Underlayer | (μm) | x | y | z | x | y | z |
| Ex. 1 | First Embodiment | 5.8 | 1.96 | 0.05 | 0.16 | 1.97 | 0.08 | 0.23 |
| Ex. 2 | First Embodiment | 5.8 | 1.96 | 0.05 | 0.16 | 1.96 | 0.08 | 0.23 |
| Ex. 3 | First Embodiment | 5.8 | 1.96 | 0.05 | 0.16 | 1.94 | 0.11 | 0.30 |
| Ex. 4 | First Embodiment | 5.5 | 1.96 | 0.05 | 0.16 | 1.94 | 0.13 | 0.38 |
| Ex. 5 | First Embodiment | 5.5 | 1.96 | 0.05 | 0.16 | 1.95 | 0.10 | 0.29 |
| Ex. 6 | First Embodiment | 8.3 | 1.96 | 0.05 | 0.16 | 1.95 | 0.10 | 0.29 |
| Ex. 7 | First Embodiment | 5.7 | 1.96 | 0 05 | 0.16 | 1.97 | 0.08 | 0.23 |
| Ex. 8 | First Embodiment | 0.4 | 1.95 | 0.09 | 0.28 | 1.95 | 0.09 | 0.28 |
| Ex. 9 | First Embodiment | 8.0 | 1.93 | 0.15 | 0.47 | 1.97 | 0.08 | 0.23 |
| Ex. 10 | Second Embodiment | 7.9 | 1.96 | 0.05 | 0.16 | 1.97 | 0.08 | 0.23 |
| Comp. Ex. 1 | Other | Substrate Clouding; Silicon Oxide Layer Natural Peeling; Not Evaluated | | | | | | |
| Comp. Ex. 2 | Other | 5.8 | 1.96 | 0.05 | 0.16 | 1.97 | 0.08 | 0.23 |
| Comp. Ex. 3 | First Embodiment | 6.0 | 1.96 | 0.05 | 0.16 | 1.93 | 0.15 | 0.47 |
| Comp. Ex. 4 | First Embodiment | 6.1 | 1.96 | 0.05 | 0.16 | 1.92 | 0.19 | 0.55 |
| Comp. Ex. 5 | First Embodiment | 4.3 | 1.96 | 0.05 | 0.16 | 1.93 | 0.15 | 0.47 |
| Comp. Ex. 6 | First Embodiment | 5.9 | 1.96 | 0.05 | 0.16 | 1.90 | 0.27 | 0.72 |
| Comp. Ex. 7 | First Embodiment | 5.0 | 1.77 | 0.57 | 1.70 | 1.77 | 0.57 | 1.70 |
| Comp. Ex. 8 | First Embodiment | 0.3 | 1.77 | 0.57 | 1.70 | 1.77 | 0.57 | 1.70 |
| Comp. Ex. 9 | First Embodiment | 3.1 | 1.66 | 0.55 | 1.41 | 1.90 | 0.28 | 0.75 |

TABLE 12-continued

| | Silicon Oxide Layer(CVD Layer) | | | | Evaluation Results | | | |
|---|---|---|---|---|---|---|---|---|
| | | | | | Wear | Boiling Water | Heat | Weathering |
| Example | b1 | b3 | c1 | c3 | Resist. | Resist. | Resist. | Resist. |
| Ex. 1 | 0.14 | 0.24 | 0.000 | 0.002 | VG | VG | VG | G |
| Ex. 2 | 0.14 | 0.21 | 0.000 | 0.002 | VG | VG | VG | G |
| Ex. 3 | 0.14 | 0.24 | 0.000 | 0.004 | VG | VG | VG | G |
| Ex. 4 | 0.14 | 0.24 | 0.000 | 0.008 | VG | VG | VG | G |
| Ex. 5 | 0.14 | 0.23 | 0.000 | 0.004 | VG | VG | VG | P |
| Ex. 6 | 0.14 | 0.23 | 0.000 | 0.004 | VG | VG | VG | G |
| Ex. 7 | 0.14 | 0.21 | 0.000 | 0.002 | VG | VG | VG | G |
| Ex. 8 | 0.19 | 0.19 | 0.002 | 0.002 | VG | VG | VG | G |
| Ex. 9 | 0.26 | 0.24 | 0.013 | 0.002 | VG | G | G | G |
| Ex. 10 | 0.14 | 0.24 | 0.000 | 0.002 | VG | G | G | VG |
| Comp. Ex. 1 | Substrate Clouding; Silicon Oxide Layer Natural Peeling; Not Evaluated | | | | | | | |
| Comp. Ex. 2 | 0.14 | 0.24 | 0.000 | 0.002 | G | P | — | — |
| Comp. Ex. 3 | 0.14 | 0.26 | 0.000 | 0.013 | P | VG | VG | VG |
| Comp. Ex. 4 | 0.14 | 0.29 | 0.000 | 0.018 | G | VG | VG | VG |
| Comp. Ex. 5 | 0.14 | 0.26 | 0.000 | 0.013 | G | VG | VG | VG |
| Comp. Ex. 6 | 0.14 | 0.28 | 0.000 | 0.016 | P | G | P | G |
| Comp. Ex. 7 | 0.37 | 0.37 | 0.052 | 0.052 | P | G | G | G |
| Comp. Ex. 8 | 0.37 | 0.37 | 0.052 | 0.052 | P | G | G | G |
| Comp. Ex. 9 | 0.35 | 0.27 | 0.054 | 0.019 | G | G | G | G |

The "wear resistance" of Table 12 is evaluated from the results of the nanoindentation measurement of the silicon oxide layer described in Tables 5 and 10, and the results of the Taber abrasion test described in Tables 6 and 11. An evaluation of "wear resistance" in the case in which the indentation hardness was 4.5 GPa or more and the Taber abrasion resistance ΔH was 1.0% or less is assigned the evaluation score of "VG", the ease in which the indentation hardness was 4.5 GPa or more or the Taber abrasion resistance ΔH was 1.0% or less is assigned the evaluation score of "G", and the case in which the indentation hardness was 4.5 GPa or less and the Taber abrasion resistance ΔH was 1.0% or more is assigned the evaluation score of "P".

The "boiling water resistance", "heat resistance", and "weather resistance" of Table 12 were determined by dividing the respective evaluations of Tables 6 and 11 into three stages. "VG", "G", and "P".

EVALUATION OF EXAMPLES AND COMPARATIVE EXAMPLES

From Tables 4 to 6 and 9 to 12 above, it can be understood preferable results were obtained when a specific cured underlayer was used, and when a position 0.4 μm from the interface between the cured underlayer and the silicon oxide layer described above and the surface thereof satisfy the specific chemical composition $SiO_xC_yH_z$ and the infrared absorbance rate, respectively. Conversely, preferable results were not obtained when these requirements were not satisfied. Specifically, from Tables 2, 5, 6 and 12, the following points were understood.

(1) Regarding Examples 1 to 4

Though the types of cured underlayers and the silicon oxide layer formation conditions by PE-CVD were different in Examples 1 to 4, suitable results regarding Taber abrasion resistance, high hardness, boiling water performance, weathering performance, and heat resistance ability were obtained.

This is because the cured underlayers of Examples 1 to 4 comprised 10 to 90 parts by weight of a multi-functional acrylate and 90 to 10 parts by weight of inorganic oxide fine particles and/or a silicon compound hydrolysis-condensation product and had a thickness of 1 to 20 μm, and the silicon layers thereof satisfied at least the following requirement ($a_1$) at a position 0.04 μm from the interface between the cured underlayer and the silicon oxide layer in the thickness direction and the surfaces thereof satisfied the following ($a_3$) on a surface on a side opposite the interface:

($a_1$) when the chemical composition of the silicon oxide layer is represented by $SiO_xC_yH_z$, x is in the range of 1.93 to 1.98, y is in the range of 0.04 to 0.15, and z is in the range of 0.10 to 0.50, and ($a_3$) when the chemical composition of the silicon oxide layer is represented by $SiO_xC_yH_z$, x is in the range of 1.94 to 2.02, y is in the range of 0.05 to 0.16, and z is in the range of 0.20 to 0.50.

Further, this is because the cured underlayers of Examples 1 to 4 satisfied all of the following preferable requirements described in ($a_1$) to ($c_1$) at a position 0.04 μm from the interface between the cured underlayer and the silicon oxide layer in the thickness direction, and satisfied all of the following preferable requirements described in ($b_3$) to ($c_3$) on the surface on the side opposite the interface:

($a_1$) when the chemical composition of the silicon oxide layer is represented by x is in the range of 1.93 to 1.98, y is in the range of 0.04 to 0.15, and 7 is in the range of 0.10 to 0.45, ($b_1$) the ratio of infrared absorbance at a wave number of 930 $cm^{-1}$ to that at a wave number of 1020 $cm^{-1}$ ($\alpha_{930}/\alpha_{1020}$) is in the range of 0.10 to 0.20, ($c_1$) the ratio of infrared absorbance at a wave number of 1280 $cm^{-1}$ to that at a wave number of 1020 $cm^{-1}$ ($\alpha_{1280}/\alpha_{1020}$) is in the range of 0 to 0.005, ($b_3$) the ratio of infrared absorbance at a wave number of 930 $cm^{-1}$ to that at a wave number of 1020 $cm^{-1}$ ($\alpha_{930}/\alpha_{1020}$) is in the range of 0.15 to 0.25, and ($c_3$) the ratio of infrared absorbance at a wave number of 1280 $cm^{-1}$ to that at a wave number of 1020 $cm^{-1}$ ($\alpha_{1280}/\alpha_{1020}$) is in the range of 0.002 to 0.020, In particular, in the formation of the high hardness layers of Examples 1 and 2, by reducing the supply gas amount to less than that of Examples 3 and 4, since a dense inorganic high hardness layer was formed, wear resistance and high hardness greater than those of Examples 3 and 4 were obtained.

(2) Regarding Example 5

Example 5 was produced in the same manner as Example 4 except that the duration of the plasma treatment of the cured underlayer was relatively long. Though there were differences therebetween in the surface roughness of the cured underlayer as measured by DFM, since at least the requirements described above in "(1) Regarding Examples 1 to 4" were satisfied, satisfactory results with regard to Taber abrasion resistance, boiling water performance, weathering performance, and heat resistance were obtained. Furthermore, though the accelerated weather resistance of Example 5 was inferior to that of Example 4, the results of wear resistance and high hardness of Example 5 were better than Example 4.

(3) Regarding Example 6

When the conditions of Example 6 are compared with those of Example 1, though only the formation conditions of the silicon oxide layer obtained by PE-CVD differed, since at least the requirements described above in "(1) Regarding Examples 1 to 4" were satisfied, satisfactory results with regard to Taber abrasion resistance, high hardness, boiling water performance, weathering performance, and heat resistance were obtained, and satisfactory results with regard to accelerated weather resistance were also obtained.

(4) Regarding Example 7

When the conditions Example 7 are compared with those of Example 1, though only the formation conditions of the silicon oxide layer obtained by PE-CVD differed, since at least the requirements described above in "(1) Regarding Examples 1 to 4" were satisfied, satisfactory results with regard to Taber abrasion resistance, high hardness, boiling water performance, weathering performance, and heat resistance were obtained, and satisfactory results with regard accelerated weather resistance were also obtained. In Example 7, the input power ratio was increased by directly increasing the input power to a level greater than that of Example 1, whereby a dense high hardness layer was formed, and thus, satisfactory results with regard to high hardness which are more suitable than Example 1 were obtained.

(5) Regarding Example 8

When the conditions of Example 8 are compared with those of Example 1, though only the formation conditions of the silicon oxide layer obtained by PE-CVD differed, since at least the requirements described above in "(1) Regarding Examples 1 to 4" were satisfied, satisfactory results with regard to Taber abrasion resistance, high hardness, boiling water performance, weathering performance, and heat resistance were obtained. Though the accelerated weather resistance of Example 8 was inferior to that of Example 1, wear resistance and high hardness greater than those of Example 1 were obtained.

(6) Regarding Example 9

When the conditions of Example 9 are compared with those of Example 1, though only the formation conditions of the silicon oxide layer obtained by PE-CVD differed, the preferred requirements described in ($a_1$) to ($c_1$) of the requirements described above in "(1) Regarding Examples 1 to 4" were not satisfied. As a result, though Example 9 achieved an extremely high degree of wear resistance, Example 1 demonstrated more satisfactory results with regard to boiling water resistance and heat resistance.

(7) Regarding Example 10

Example 10 differed from Example 1 in only the type of the cured underlayer. As a result, though Example 10 achieved an extremely high degree of wear resistance, Example 1 demonstrated more satisfactory results with regard to boiling water resistance and heat resistance, (6) Comparison of Example 1 and Comparative Example 1

Example 1 and Comparative Example 1 have identical cured underlayer plasma treatment conditions and formation conditions of the silicon oxide layer obtained by PE-CVD (refer to Tables 2 and 7). However, in Example 1, a substrate which demonstrated satisfactory results in wear resistance, high hardness, and heat resistance was obtained, whereas in Comparative Example 1, a substrate worthy of evaluation could not be obtained. In Comparative Example 1, the inorganic component ratios of the cured underlayer coating agent were below the lower limit of the numerical value ranges of the requirements described above in "(1) Regarding Examples 1 to 4", and thus, the requirements were not satisfied. As a result, the cured underlayer decomposed/deteriorated during the plasma treatment, whereby surface roughness was increased significantly, and a silicon oxide layer worthy of evaluation could not be formed.

(7) Comparison of Example 1 and Comparative Example 2

Though Example 1 and Comparative Example 2 had identical cured underlayer plasma treatment conditions and formation conditions of the silicon oxide layer obtained by PE-CVD, they differed with regard to initial adhesion performance, high hardness, boiling water performance, weathering performance, and accelerated weather performance, with Example 1 achieving satisfactory results, and Comparative Example 2 achieving insufficient results. Regarding the cured underlayer of Comparative Example 2, the ratios of the inorganic components were greater than the upper limits of the numerical value ranges of the requirements described above in "(1) Regarding Examples 1 to 4", and thus, the requirements were not satisfied.

(8) Comparison of Example 1 and Comparative Examples 3 and 5

Example 1 and Comparative Examples 3 and 5 differed only in the formation conditions of the silicon oxide layer obtained by PE-CVD. Since x of the chemical composition $SiO_xC_yH_z$ of Comparative Examples 3 and 5 was outside of the range of the requirement of the surface of the silicon oxide layer described above in "(1) Regarding Examples 1 to 4" with regard to requirement ($a_3$), and the ratio of infrared absorbance ($\alpha_{930}/\alpha_{1020}$) of the surface with regard to requirement ($b_3$) was outside of the preferred range, the wear resistance was insufficient.

(9) Comparison of Example 1 and Comparative Example 4

Example 1 and Comparative Example 4 differed only in the formation conditions of the silicon oxide layer obtained by PE-CVD. Since x, y, and z of the chemical composition $SiO_xC_yZ_z$ of Comparative Example 4 were outside of the ranges of the requirements of the surface of the silicon oxide layer described above in "(1) Regarding Examples 1 to 4" with regard to requirement ($a_3$), and the ratio of infrared absorbance ($\alpha_{930}/\alpha_{1020}$) with regard to requirement ($b_3$) was outside of the preferred range, the high hardness was insufficient.

(10) Comparison of Example 1 and Comparative Example 6

Example 1 and Comparative Example 6 differed only in the formation conditions of the silicon oxide layer obtained by PE-CVD, Since a high hardness layer was not present in Comparative Example 6 and formation of the silicon oxide layer ended at the bulk layer, x, and z of the chemical composition $SiO_xC_yZ_z$ were outside of the ranges of the requirements of the surface of the silicon oxide layer described above in "(1) Regarding Examples 1 to 4" with regard to requirement ($a_3$), and the ratio of infrared absorbance ($\alpha_{930}/\alpha_{1020}$) with regard to requirement ($b_3$) was outside of the preferred range, the Taber abrasion resistance, high hardness, boiling water resistance, and heat resistance were insufficient.

(13) Comparison of Example 1 and Comparative Examples 7 and 8

Example 1 and Comparative Examples 7 and 8 differed in the formation conditions of the silicon oxide layer obtained by PE-CVD, and in Comparative Examples 7 and 8, x, y, and z of the chemical composition $SiO_xC_yH_z$ of the silicon oxide layer 0.04 μm from the interface with the cured underlayer were outside the ranges of the requirements described above in "(1) Regarding Examples 1 to 4" with regard to requirement ($a_1$). Furthermore, the ratio of infrared absorbance ($\alpha_{930}/\alpha_{1020}$) of requirement ($b_1$) and the ratio of infrared absorbance ($\alpha_{1280}/\alpha_{1020}$) of requirement ($c_1$) of the silicon oxide layer were outside of the preferred ranges. Further, since x, y, and z of the chemical composition $SiO_xC_yH_z$ of the surface of the silicon oxide layer were outside of the ranges of the requirements described above with regard to requirement ($a_3$), and the ratio of infrared absorbance ($\alpha_{930}/\alpha_{1020}$) of requirement ($b_3$) and the ratio of infrared absorbance ($\alpha_{1280}/\alpha_{1020}$) of requirement ($c_3$) were outside of the preferred ranges, the Taber abrasion resistance, high hardness, boiling water resistance, and heat resistance were insufficient.

(14) Comparison of Example 1 and Comparative Example 9

Example 1 and Comparative Example 9 differed in the type of the cured underlayer and the formation conditions of the silicon oxide layer obtained by PE-CVD, In Comparative Example 11, x, y, and z of the chemical composition $SiO_xC_yH_z$ of the silicon oxide layer 0.04 μm from the interface with the cured underlayer were outside of the ranges of the requirements described above in "(1) Regarding Examples 1 to 4" with regard to requirement ($a_1$), and the ratio of infrared absorbance ($\alpha_{930}/\alpha_{1020}$) of requirement ($b_1$) and the ratio of the infrared absorbance ($\alpha_{1280}/\alpha_{1020}$ n) of requirement ($c_1$) were outside of the preferred ranges. Furthermore, since x, y, and z of the chemical composition $SiO_xC_yH_z$ of the surface of the silicon oxide layer were outside of the ranges of the requirements described above with regard to requirement ($a_3$), and the ratio of the infrared absorbance ($\alpha_{930}/\alpha_{1020}$) of requirement ($b_3$) was outside of the preferred range, the high hardness, boiling water resistance, and heat resistance were insufficient.

INDUSTRIAL APPLICABILITY

The polymer substrate with hard coating layer of the present invention has superior surface abrasion resistance comparable to that of inorganic glass and is also provided with a high level of environmental resistance enabling it to be used for long periods of time even in harsh usage environments, and can be used in, for example, automobile window materials, construction members and surface protective plates of solar batteries, thereby making it extremely useful.

REFERENCE SIGNS LIST

1 Vacuum vessel
2 Power supply
3 Matching box
4 Exhaust port
5 Vacuum pump
6A Cooling medium
7 Reaction gas
10 Cathode electrode
14 Shielding component
20 Anode electrode
30,31 Treated substrates
40,41 Gas introducing head
40A,41A Blowout holes
40B,41B Inlets
50 Polymer substrate
60 Adhesive layer
70 Cured underlayer
80 Silicon oxide layer obtained by PE-CVD
81 Cut line (separation starting line)

The invention claimed is:

1. A polymer substrate with a hard coat layer in which a polymer substrate, a cured underlayer, and a silicon oxide layer are directly laminated in this order, wherein
the cured underlayer has a thickness of 1 to 20 μm, and comprises 10 to 90 parts by weight of a multi-functional acrylate and 90 to 10 parts by weight of inorganic oxide fine particles and/or a silicon compound hydrolysis-condensation product, or comprises a hydrolysis-condensation product of an organic silicon compound as a main component thereof,
the silicon oxide layer satisfies the following ($a_1$) at a position 0.04 μm from the interface between the cured underlayer and the silicon oxide layer in the thickness direction and satisfies the following ($a_3$) on a surface on a side opposite the interface:
($a_1$) when the chemical composition is represented by $SiO_xC_yH_z$, x is in the range of 1.93 to 1.98, y is in the range of 0.04 to 0.15, and z is in the range of 0.10 to 0.50, and
($a_3$) when the chemical composition is represented by $SiO_xC_yH_z$, x is in the range of 1.94 to 2.02, y is in the range of 0.05 to 0.16, and z is in the range of 0.20 to 0.50.

2. The polymer substrate with a hard coat layer according to claim 1, wherein the silicon oxide layer satisfies all of the following requirements ($a_1$) to ($c_1$) at a position 0.04 μm from the interface between the cured underlayer and the silicon oxide layer in the thickness direction, and satisfies all of the following requirements ($b_3$) to ($c_3$) on the surface on the side opposite the interface:
   ($a_1$) when the chemical composition is represented by $SiO_xC_yH_z$, x is in the range of 1.93 to 1.98, y is in the range of 0.04 to 0.15, and z is in the range of 0.10 to 0.45,
   ($b_1$) the ratio of infrared absorbance at a wave number of 930 $cm^{-1}$ to that at a wave number of 1020 $cm^{-1}$ ($\alpha_{930}/\alpha_{1020}$) is in the range of 0.10 to 0.20,
   ($c_1$) the ratio of infrared absorbance at a wave number of 1280 $cm^{-1}$ to that at a wave number of 1020 $cm^{-1}$ ($\alpha_{1280}/\alpha_{1020}$) is in the range of 0 to 0.005,
   ($b_3$) the ratio of infrared absorbance at a wave number of 930 $cm^{-1}$ to that at a wave number of 1020 $cm^{-1}$ ($\alpha_{930}/\alpha_{1020}$) is in the range of 0.15 to 0.25, and
   ($c_3$) the ratio of infrared absorbance at a wave number of 1280 $cm^{-1}$ to that at a wave number of 1020 $cm^{-1}$ ($\alpha_{1280}/\alpha_{1020}$) is in the range of 0.002 to 0.020.

3. The polymer substrate with a hard coat layer according to claim 2, wherein the cured underlayer comprises 10 to 90 parts by weight of a multi-functional acrylate, and 90 to 10 parts by weight of inorganic fine particles and/or a silicon compound hydrolysis-condensation product.

4. The polymer substrate with a hard coat layer according to claim 1, wherein y of ($a_3$) is 0.02 to 0.10 greater than y of ($a_1$), and z of ($a_3$) is 0.05 to 0.25 greater than z of ($a_1$).

5. The polymer substrate with a hard coat layer according to claim 1, wherein the cured underlayer comprises a (meth)acrylic resin including 0.1 to 5 mol/kg of at least one of a hydroxyl group, an amino group, a carboxyl group, or an alkoxysilyl group in the compound.

6. The polymer substrate with a hard coat layer according to claim 1, wherein the primary particle diameter of the inorganic oxide fine particles is in the range of 1 nm to 200 nm.

7. The polymer substrate with a hard coat layer according to claim 1, wherein the polymer substrate is a polycarbonate resin substrate.

8. The polymer substrate with a hard coat layer according to claim 1, wherein the silicon oxide layer is a plasma CVD layer.

9. The polymer substrate with a hard coat layer according to claim 1, wherein the silicon oxide layer has a thickness of 2.5 to 9 μm, and satisfies all of the following requirements ($a_2$) to ($c_2$) at a position 2.0 μm from the interface between the cured underlayer and the silicon oxide layer in the thickness direction:
   ($a_2$) when the chemical composition is represented by $SiO_xC_yH_z$, x is in the range of 1.81 to 1.90, y is in the range of 0.15 to 0.32, and z is in the range of 0.45 to 0.90,
   ($b_2$) the ratio of infrared absorbance at a wave number of 930 $cm^{-1}$ to that at a wave number of 1020 $cm^{-1}$ ($\alpha_{930}/\alpha_{1020}$) is in the range of 0.21 to 0.36, and
   ($c_2$) the ratio of infrared absorbance at a wave number of 1280 $cm^{-1}$ to that at a wave number of 1020 $cm^{-1}$ ($\alpha_{1280}/\alpha_{1020}$) is in the range of 0.010 to 0.040.

10. The polymer substrate with a hard coat layer according to claim 9, wherein the thickness of a portion of the silicon oxide layer which satisfies all of requirements ($a_2$) to ($c_2$) is in the range of 1.5 to 8.5 μm.

11. The polymer substrate with a hard coat layer according to claim 9, wherein the thickness of a portion of the silicon oxide layer which satisfies all of requirements ($a_3$) to ($c_3$) is in the range of 0.1 to 1.4 μm.

12. The polymer substrate with a hard coat layer according to claim 9, further comprising, between the portion of the silicon oxide layer which satisfies all of requirements ($a_1$) to ($c_1$) and the portion of the silicon oxide layer which satisfies all of requirements ($a_2$) to ($c_2$), a gradient layer in which the values of x, y, z, $\alpha_{930}/\alpha_{1020}$ and/or $\alpha_{1280}/\alpha_{1020}$ change gradually.

13. The polymer substrate with a hard coat layer according to claim 9, further comprising, between the portion of the silicon oxide layer which satisfies all of requirements ($a_2$) to ($c_2$) and the portion of the silicon oxide layer which satisfies all of requirements ($a_3$) to ($c_3$), a gradient layer in which the values of x, y, z, $\alpha_{930}/\alpha_{1020}$ and/or $\alpha_{1280}\alpha_{1020}$ change gradually.

14. The polymer substrate with a hard coat layer according to claim 1, wherein the thickness of the silicon oxide layer is in the range of 0.1 to 2.5 μm.

15. The polymer substrate with a hard coat layer according to claim 14, further comprising, between the portion of the silicon oxide layer which satisfies all of requirements ($a_1$) to ($c_1$) and the portion of the silicon oxide layer which satisfies all of requirements ($a_3$) to ($c_3$), a gradient layer in which the values of x, y, z, $\alpha_{930}/\alpha_{1020}$ and/or $\alpha_{1280}/\alpha_{1020}$ change gradually.

* * * * *